United States Patent
Kuroi et al.

[19]

[11] Patent Number: 6,127,737
[45] Date of Patent: *Oct. 3, 2000

[54] SEMICONDUCTOR DEVICE AND MANUFACTURING METHOD THEREOF

[75] Inventors: Takashi Kuroi; Katsuyuki Horita; Maiko Sakai; Yasuo Inoue, all of Tokyo, Japan

[73] Assignee: Mitsubishi Denki Kabushiki Kaisha, Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/943,520

[22] Filed: Oct. 3, 1997

[30] Foreign Application Priority Data

Apr. 11, 1997 [JP] Japan ................................. 9-093677

[51] Int. Cl.[7] .................................................. H01L 23/544
[52] U.S. Cl. .................................................. 257/797
[58] Field of Search ........................... 257/797; 438/401, 438/462, 975

[56] References Cited

U.S. PATENT DOCUMENTS

| | | |
|---|---|---|
| 5,310,691 | 5/1994 | Suda . |
| 5,329,334 | 7/1994 | Yim et al. ................................. 355/53 |
| 5,578,519 | 11/1996 | Cho . |

FOREIGN PATENT DOCUMENTS

| | | |
|---|---|---|
| 0 562 309 A2 | 9/1993 | European Pat. Off. . |
| 43 41 171 A1 | 6/1995 | Germany . |
| 2-164018 | 6/1990 | Japan . |
| 7-176463 | 7/1995 | Japan . |
| 7-283302 | 10/1995 | Japan . |

*Primary Examiner*—Tom Thomas
*Assistant Examiner*—Thien F. Tran
*Attorney, Agent, or Firm*—Oblon, Spivak, McClelland, Maier & Neustadt, P.C.

[57] ABSTRACT

In a semiconductor device with a trench-type element isolation structure, alignment can be performed with high accuracy without any deterioration in device performance. The surfaces of silicon oxide films (2B, 2C) embedded in trenches (10B, 10C) of an element forming region including a memory cell region (11B) and a peripheral circuit region (11C) in a semiconductor substrate (1), respectively, are almost level with the surface of the semiconductor substrate (1). On the other hand, the surface of a silicon oxide film (2A) embedded in a trench (10A) is formed lower than the surface of the semiconductor substrate (1).

5 Claims, 24 Drawing Sheets

SEMICONDUCTOR DEVICE AND MANUFACTURING METHOD THEREOF

BACKGROUND OF THE INVENTION

1. Field of the Invention

The present invention is related to a semiconductor device and a manufacturing method thereof, especially to an alignment mark for superimposing a first electrode on an element active region with high accuracy in a semiconductor device having a trench-type element isolation structure.

2. Background of the Invention

In a manufacturing process of a semiconductor integrated circuit, an element isolation structure including an element isolation region needs to be formed in order to perfectly and separately control operation of each element without any electrical interference between the elements. What has been proposed as the method is a trench-type element isolation for forming a trench in a semiconductor substrate and embedding an insulating film therein.

Now, a conventional trench-type element isolation structure and its manufacturing method will be described in detail. FIG. 40 shows a sectional structure of a DRAM after the trench-type element isolation structure is formed. A silicon oxide film 2 (2A through 2C) is embedded in trenches formed in a semiconductor substrate 1. More specifically, an embedded silicon oxide film 2A is formed in an alignment mark region 11A, a relatively narrow embedded silicon oxide film 2B in a memory cell region 11B, and a relatively wide embedded silicon oxide film 2C in a peripheral circuit region 11C.

The surfaces of the silicon oxide film 2 in the trenches and the semiconductor substrate 1 are level, so that the whole surface of the semiconductor substrate 1 is flat.

FIGS. 41 through 47 are sectional views illustrating a manufacturing process of the DRAM shown in FIG. 40. Now, the manufacturing process will be described in detail, referring to those figures.

A silicon oxide film 3 and a silicon nitride film 4 are formed on the semiconductor substrate 1. Then, a predetermined area of those films are removed by photolithography and dry etching to form trenches 10 (10A through 10C) to a predetermined depth in the semiconductor substrate 1, as shown in FIG. 41. More specifically, a relatively wide trench 10A is formed in the alignment mark region 11A, a relatively narrow trench 10B in the memory cell region 11B, and a relatively wide trench 10C in the peripheral circuit region 11C.

After side and bottom faces of the trenches 10 are thermally oxidized as shown in FIG. 42, the silicon oxide film 2 is deposited by a LPCVD method. At this time, while film thickness on the wide trenches 10A and 10C is proportional to what is actually deposited thereon along the shape of those trenches, film thickness on the narrow trench 10B is thicker than what is actually deposited thereon because the trench 10B has been filled by the silicon oxide film 2 in the early deposition.

In order to reduce absolute difference in level, as shown in FIG. 43, a resist pattern 5 is formed only on the relatively wide embedded silicon oxide film 2 by photolithography, and the silicon oxide film 2 is partly removed by dry etching.

After the resist pattern 5 is removed, the whole surface of the semiconductor substrate 1 is polished by a CMP (Chemical Mechanical Polishing) method to remove the silicon oxide film 2 formed on the silicon nitrogen film 4 and a part of the silicon oxide film 2 filled in the trenches 10A through 10C as shown in FIG. 44.

The silicon nitrogen film 4 and the silicon oxide film 3 are, as shown in FIG. 45, removed by using phosphoric acid and hydrofluoric acid, respectively, to form the embedded silicon oxide film 2A in the alignment mark region 11A, the embedded silicon oxide film 2B in the memory cell region 11B, and the embedded silicon oxide film 2C in the peripheral circuit region 11C, completing the trench-type element isolation structure.

Then, a gate oxide film 6 is formed by thermal oxidation, and a polysilicon film 7 doped with phosphorus and a tungsten silicide film 8 are deposited thereon, as shown in FIG. 46.

The embedded silicon oxide film 2A (alignment mark) formed in the alignment mark region 11A in the element isolation forming process is used in photolithography to form a pattern for superimposing a gate electrode on the element isolation region. Then, as shown in FIG. 47, a gate electrode 14 is formed in the memory cell region 11B and the peripheral circuit region 11C by partly removing the tungsten silicide film 8 and the polysilicon film 7 by dry etching.

The above-described conventional semiconductor device (DRAM) and its manufacturing method have some problems discussed below.

In patterning, the gate electrode 14 which is a first electrode material needs to be superimposed on an active region so that a pattern is formed in a predetermined area of the active region. For this, the alignment mark 2A formed in the alignment mark region 11A in the element isolation forming process is used.

Typical alignment methods includes a first method for recognizing a mark by detecting diffracted light with no photosensitivity to resists, and a second method for detecting a mark by recognizing picture information. The first method requires a difference in level produced by irregularity of the mark formed in the semiconductor substrate. In the second method, it is required either to detect fundamental mark information by transmitting light through the gate electrode material or to recognize mark information in accordance with a difference in level.

However, there is no difference in level in an alignment mark portion of the conventional semiconductor device with the trench-type element isolation structure, so that it is difficult to apply the first method which requires a difference in level to detect a mark. Further, as the silicide film which is a part of the gate electrode material does not transmit light, detection by the second method is also difficult.

Consequently, a S/N ratio of a mark detection signal falls and accuracy in alignment is reduced, thereby failing to superimpose a gate electrode in its formation.

Further, accuracy in alignment can be increased by forming the embedded silicon oxide film 2A in the trench lower than the surface of the semiconductor substrate, by which, however, the embedded silicon oxide films 2B and 2C simultaneously formed in the element forming region (memory cell region 11B and peripheral circuit region 11C) are also lowered.

This causes electric field concentration from the gate electrode, and hump in current/voltage characteristics of a transistor, increasing variation in threshold voltage and current in stand-by condition.

At the same time, as deposited thick in edges of the embedded silicon oxide films 2B and 2C, the gate electrode material remains in the edges in electrode etching, resulting in reduction in yield of elements.

When the embedded silicon oxide film 2A in the trench is formed higher than the surface of the semiconductor substrate, accuracy in alignment is increased, and hump in current/voltage characteristics of a transistor less occurs. This, however, increases difference in level in edges of the trenches and increases film thickness of the gate electrode material in upper portions of the edges. As the result, the gate electrode material remains in the edges in electrode etching, reducing yield of elements.

SUMMARY OF THE INVENTION

A first aspect of the present invention is directed to a semiconductor device having a trench-type element isolation structure for semiconductor element isolation. The semiconductor device comprises: a semiconductor substrate; an alignment mark region formed in the semiconductor substrate, having an alignment mark which includes at least a first trench formed in an upper portion of the semiconductor substrate; and an element forming region formed in the semiconductor substrate, having an element isolation insulating film for insulating a plurality of semiconductor elements from each other, the element isolation insulating film being filled in a second trench formed in an upper portion of the semiconductor substrate, the first and second trenches having about the same depth below the surface of the semiconductor substrate, wherein a difference in level is provided between the surface of the alignment mark and the surface of the semiconductor substrate by forming the surface of the alignment mark lower than the surface of the semiconductor substrate so that another difference in level reflecting the difference in level between the surface of the alignment mark and the surface of the semiconductor substrate is provided on a surface of an upper formation layer when the upper formation layer is formed on the semiconductor substrate including the alignment mark.

Preferably, according to a second aspect of the present invention, the alignment mark further includes an insulating film in alignment mark trench, filled in a lower portion of the first trench, and a difference in level is provided between the surface of the insulating film in alignment mark trench and the surface of the semiconductor substrate by forming the insulating film in alignment mark trench lower than the surface of the semiconductor substrate so that another difference in level reflecting the difference in level between the surface of the insulating film in alignment mark trench and the surface of the semiconductor substrate is provided on a surface of an upper formation layer when the upper formation layer is formed on the semiconductor substrate including the insulating film in alignment mark trench.

Preferably, according to a third aspect of the present invention, the surface of the element isolation insulating film is higher than the surface of the semiconductor substrate. The semiconductor device of the first aspect of the present invention further comprises: a control electrode for controlling operation of elements, formed on the element forming region having the element isolation insulating film.

Preferably, according to a fourth aspect of the present invention, the surface of the insulating film in alignment mark trench is over 30 nm lower than the surface of the semiconductor substrate.

Preferably, according to a fifth aspect of the present invention, a plane structure of the first trench of the alignment mark is a rectangle with its short sides two or more times longer than a depth of the first trench.

Preferably, according to a sixth aspect of the present invention, the semiconductor device further comprises an electrode layer formed on the element forming region, the electrode layer including one of a metal layer and a metal compound layer.

Preferably, according to a seventh aspect of the present invention, the alignment mark includes a trench whose inside is completely exposed, and a difference in level is provided between the bottom of the first trench and the surface of the semiconductor substrate by forming the bottom of the first trench lower than the surface of the semiconductor substrate so that another difference in level reflecting the difference in level between the bottom of the first trench and the surface of the semiconductor substrate is provided on a surface of an upper formation layer when the upper formation layer is formed on the semiconductor substrate including the first trench.

An eighth aspect of the present invention is directed to a manufacturing method of a semiconductor device with a trench-type element isolation structure. The manufacturing method of a semiconductor device comprises the steps of: (a) preparing a semiconductor substrate having an alignment mark region and an element forming region; (b) simultaneously forming first and second trenches in upper portions of the alignment mark region and the element forming region of the semiconductor substrate, respectively, the first and second trenches having almost the same depth below the surface of the semiconductor substrate; (c) forming an insulating film on the whole surface of the semiconductor substrate; (d) forming a resist pattern on the insulating film except at least a region of the insulating film corresponding to the alignment mark region; (e) removing the insulating film, using the resist pattern as a mask; (f) further removing the insulating film after the resist pattern is removed so that the insulating film embedded in the second trench only remains, the first trench after the step (f) being defined as an alignment mark; (g) forming an electrode layer on the whole surface of the semiconductor substrate; and (h) recognizing a position of the alignment mark to pattern the electrode layer on the element forming region, wherein a difference in level is provided between the surface of the alignment mark and the surface of the semiconductor substrate by forming the surface of the alignment mark lower than the surface of the semiconductor substrate so that another difference in level reflecting the difference in level between the surface of the alignment mark and the surface of the semiconductor substrate is provided on the surface of the electrode layer when the electrode layer is formed on the semiconductor substrate including the alignment mark Preferably, according to a ninth aspect of the present invention, the step (e) includes a step of removing a part of the insulating film on the first trench;

the step (f) is performed so that the insulating film remains in a lower portion of the first trench; the alignment mark is defined by both the first trench and an insulating film in alignment mark trench formed in a lower portion of the first trench; and a difference in level is provided between the surface of the insulating film in alignment mark trench and the surface of the semiconductor substrate by forming the insulating film in alignment mark trench lower than the surface of the semiconductor substrate so that another difference in level between the surface of the insulating film in alignment mark trench and the surface of the semiconductor substrate is provided on an electrode layer when the electrode layer is formed on the semiconductor substrate including the insulating film in alignment mark trench.

Preferably, according to a tenth aspect of the present invention, the step (e) includes a step of removing the whole of the insulating film filled in and formed on the first trench; the alignment mark is defined only by the first trench; and a difference in level is provided between the bottom of the first trench and the surface of the semiconductor substrate by forming the bottom of the first trench lower than the surface of the semiconductor substrate so that another difference in level reflecting the difference in level between the bottom of the first trench and the surface of the semiconductor substrate is provided on the electrode layer when the electrode layer is formed on the semiconductor substrate including the first trench.

Preferably, according to an eleventh aspect of the present invention, the second trench includes a relatively narrow first circuit trench and a relatively wide second circuit trench; the element forming region includes a first circuit forming region for element isolation in the first circuit trench, and a second circuit forming region for element isolation in the second circuit trench; and in the step (d), the resist pattern is formed on the insulating film except a region of the insulating film corresponding to the alignment mark region and the first circuit forming region.

Preferably, according to a twelfth aspect of the present invention, the first circuit forming region includes a region consisting of dynamic memory cells; and the second circuit forming region includes a region forming a peripheral circuit for driving the memory cells.

A thirteenth aspect of the present invention is directed top a manufacturing method of a semiconductor device with a trench-type element isolation structure. The manufacturing method of the present invention comprises the steps of: (a) preparing a semiconductor substrate having an alignment mark region and an element forming region; (b) forming first and second trenches in upper portions of the alignment mark region and the element forming region, respectively, the depth of the first trench being deeper than the depth of the second trench from the surface of the semiconductor substrate; (c) forming an insulating film on the whole surface of the semiconductor substrate; (d) removing the insulating film so as to leave an insulating film in alignment mark trench in a lower portion of the first trench and the insulating film embedded in the second trench, both the first trench and the insulating film in alignment mark trench after the step (d) being defined as alignment marks; (e) forming an electrode layer on the whole surface of the semiconductor substrate; and (f) recognizing positions of the alignment marks to pattern the electrode layer on the element forming region, wherein a difference in level is provided between the surface of the insulating film in alignment mark trench and the surface of the semiconductor substrate by forming the insulating film in alignment mark trench lower than the surface of the semiconductor substrate so that another difference in level reflecting the difference in level between the surface of the insulating film in alignment mark trench and the surface of the semiconductor substrate is provided on an electrode layer when the electrode layer is formed on the semiconductor substrate including the insulating film in alignment mark trench.

Preferably, according to a fourteenth aspect of the present invention, the step (d) further includes the steps of: (d-1) forming a resist pattern on the insulating film except a region of the insulating film corresponding to the alignment mark region; (d-2) removing the insulating film, using the resist pattern as a mask; and (d-3) further removing the insulating film after the resist pattern is removed.

Preferably, according to a fifteenth aspect of the present invention, the second trench includes a relatively narrow first circuit trench and a relatively wide second circuit trench, the element forming region includes a first circuit forming region for element isolation in the first circuit trench, and a second circuit forming region for element isolation in the second circuit trench; and in the step (d), the resist pattern is formed on the insulating film except a region of the insulating film corresponding to the alignment mark region and the first circuit forming region.

Preferably, according to a sixteenth aspect of the present invention, the first circuit forming region includes a region consisting of dynamic memory cells;

and the second circuit forming region includes a region forming a peripheral circuit for driving the memory cells.

In accordance with the semiconductor device of the first aspect, a difference in level is provided between the surface of the alignment mark and the surface of the semiconductor substrate by forming the surface of the alignment mark lower than the surface of the semiconductor substrate so that another difference in level reflecting the difference in level between the surface of the alignment mark and the surface of the semiconductor substrate is provided on the surface of the upper formation layer when the upper formation layer is formed on the semiconductor substrate including the alignment mark. The difference in level of the upper formation layer facilitates detection of a position of the alignment mark, achieving the semiconductor device with high positional accuracy.

In accordance with the semiconductor device of the second aspect, the insulating film in alignment mark trench which constitutes the alignment mark is formed in a lower portion of the first trench. A difference in level is provided between the surface of the insulating film in alignment mark trench and the surface of the semiconductor substrate by forming the insulating film in alignment mark trench lower than the surface of the semiconductor substrate so that another difference in level reflecting the difference in level between the surface of the insulating film in alignment mark trench and the surface of the semiconductor substrate is provided on the surface of the upper formation layer when the upper formation layer is formed on the semiconductor substrate including the insulating film in alignment mark trench. This facilitates detection of a position of the alignment mark and achieves the semiconductor device with high positional accuracy.

In addition, as the insulating film in alignment mark trench is formed in a lower portion of the first trench and thus its upper portion is completely exposed, configuration of edge in the surface of the first trench is reflected as a difference in level between the surface of the alignment mark and the surface of the semiconductor substrate, achieving the semiconductor device with high positional accuracy.

In the semiconductor device of the third aspect, the surface of the element isolation insulating film is formed higher than the surface of the semiconductor substrate to form a difference in level. When the control electrode is formed on the difference in level to constitute semiconductor elements which operate with application of control voltage to the control electrode, the degree of difference in level is determined so as to reduce difference in degree of transmission of electric field from the control electrode between the semiconductor substrate and the element isolation insulating film. This leads to uniform distribution of electric field without electric field concentration when the control voltage is applied to the control electrode In the semiconductor device of the fourth aspect, the surface of the insulating film in alignment mark trench is over 300 nm lower than the surface of the semiconductor substrate. Thus, it is relatively easy to form a difference in level between the surface of the insulating film in alignment mark trench and the surface of the semiconductor substrate so that another difference in level reflecting the difference in level between the surface of the insulating film in alignment mark trench and the surface of the semiconductor substrate is provided on the surface of the upper formation layer when the upper formation layer is formed on the semiconductor substrate including the insulating film in alignment mark trench.

In the semiconductor device of the fifth aspect, the plane structure of the first trench of the alignment mark is a rectangle with its short sides two or more times longer than the depth of the first trench. Thus, it is relatively easy to form a difference in level between the surface of the insulating film in alignment mark trench and the surface of the semiconductor substrate so that another difference in level reflecting the difference in level between the surface of the insulating film in alignment mark trench and the surface of the semiconductor substrate is provided on the surface of the upper formation layer when the upper formation layer is formed on the semiconductor substrate including the insulating film in alignment mark trench.

In the semiconductor device of the sixth aspect, the electrode layer formed on the element forming region is one of a metal layer and a metal compound layer. Thus, when the electrode layer is formed on the whole surface of the element forming region, it is impossible to recognize image of the insulating film in alignment mark trench formed below the electrode layer. However, the difference in level between the surface of the insulating film in alignment mark trench and the surface of the semiconductor substrate is reflected to the surface of the electrode layer to be formed thereon, which facilitates detection of a position of the alignment mark and enables highly accurate patterning of the electrode layer in accordance with the alignment mark.

In the semiconductor device of the seventh aspect, the bottom of the first trench is formed lower than the surface of the semiconductor substrate to form a difference in level so that another difference in level reflecting the difference in level between the bottom of the first trench and the surface of the semiconductor device is provided on the surface of the upper formation layer when the upper formation layer is formed on the semiconductor substrate including the first trench. This facilitates detection of a position of the alignment mark, achieving the semiconductor device with high positional accuracy.

In the manufacturing method of the semiconductor device of the eighth aspect, the surface of the alignment mark is formed lower than the surface of the semiconductor substrate to form a difference in level so that the difference in level between the surface of the alignment mark and the surface of the semiconductor layer is reflected to the electrode layer to be formed thereon. This facilitates detection of a position of the alignment mark in the step (h), and enables highly accurate patterning of the electrode layer in accordance with the alignment mark.

In the manufacturing method of the semiconductor device of the ninth aspect, the surface of the insulating film in alignment mark trench which is a part of the alignment mark formed is formed lower than the surface of the semiconductor substrate to form a difference in level so that another difference in level reflecting the difference in level between the surface of the insulating film in alignment mark trench and the surface of the semiconductor substrate is provided on the surface of the electrode layer to be formed thereon. Thus, the difference in level of the electrode layer can be defined as the alignment mark.

In the manufacturing method of the semiconductor device of the tenth aspect, the bottom of the first trench which is the alignment mark is formed lower than the surface of the semiconductor substrate to form a difference in level so that another difference in level reflecting the difference in level between the bottom of the first trench and the surface of the semiconductor substrate is provided on the surface of the electrode layer to be formed thereon. The difference in level of the electrode layer can be defined as the alignment mark.

In the manufacturing method of the semiconductor device of the eleventh aspect, the element forming region includes the first circuit forming region for element isolation in the relatively narrow first circuit trench, and the second circuit forming region for element isolation in the relatively wide second circuit trench.

As the insulating film formed on the relatively narrow first circuit trench is naturally thicker than the insulating film formed on the relatively wide second circuit trench, there is more insulating film to be removed on the first circuit forming region than on the second circuit forming region. This requires another step for selectively removing the insulating film on the first circuit region.

In the step (d), the insulating films on the first circuit forming region and the alignment mark region are simultaneously removed to form the alignment mark without any additional steps. In the alignment mark, there is a difference in level between the surface of the alignment mark and the surface of the semiconductor substrate which is reflected to the electrode layer to be formed thereon.

In the semiconductor device of the twelfth aspect, as the first circuit forming region includes a region consisting of dynamic memory cells, it is possible to pattern the electrode layer of the dynamic memory cells with high accuracy.

In the manufacturing method of the thirteenth aspect, the surface of the insulating film in alignment mark trench which is a part of the alignment mark is formed lower than the surface of the semiconductor substrate to form a difference in level which is reflected to the electrode layer to be formed thereon. This facilitates detection of the alignment mark and enables highly accurate patterning of the electrode layer in accordance with the alignment mark.

In accordance with the manufacturing method of the semiconductor device of the fourteenth aspect, the insulating film is removed with the resist pattern, formed on the insulating film not in the alignment mark region, as a mask in the step (d-2). Thus, the difference in level between the surface of the insulating film in alignment mark trench and the surface of the semiconductor substrate after the step (d-3) is reflected to the electrode layer to be formed thereon.

In the manufacturing method of the semiconductor device of the fifteenth aspect, the element forming region includes the first circuit forming region for element isolation in the relatively narrow first circuit trench, and the second circuit forming region for element isolation in the relatively wide circuit trench.

As the insulating film formed on the relatively narrow first circuit trench is naturally thicker than the insulating film formed on the relatively wide second circuit trench, there is more insulating film to be removed on the first circuit forming region than on the second circuit forming region. This requires another step for selectively removing the insulating film on the first circuit forming region.

In the step (d), the insulating films in the first circuit forming region and the alignment mark region are simultaneously removed to form the alignment mark without any additional steps. In the alignment mark, there is a difference in level between the surface of the alignment mark and the surface of the semiconductor substrate which is reflected to the electrode layer to be formed thereon.

In the semiconductor device of the sixteenth aspect, as the first circuit forming region includes a region consisting of dynamic memory cells, it is possible to pattern the electrode layer of the dynamic memory cells with high accuracy.

The present invention provides the semiconductor device with the trenchtype element isolation structure for performing alignment with high accuracy without any deterioration in device performance, and its manufacturing method.

These and other objects, features, aspects and advantages of the present invention will become more apparent from the following detailed description of the present invention when taken in conjunction with the accompanying drawings.

DESCRIPTION OF THE PREFERRED EMBODIMENTS

1. First Preferred Embodiment 1-1. Structure

Figure 1:
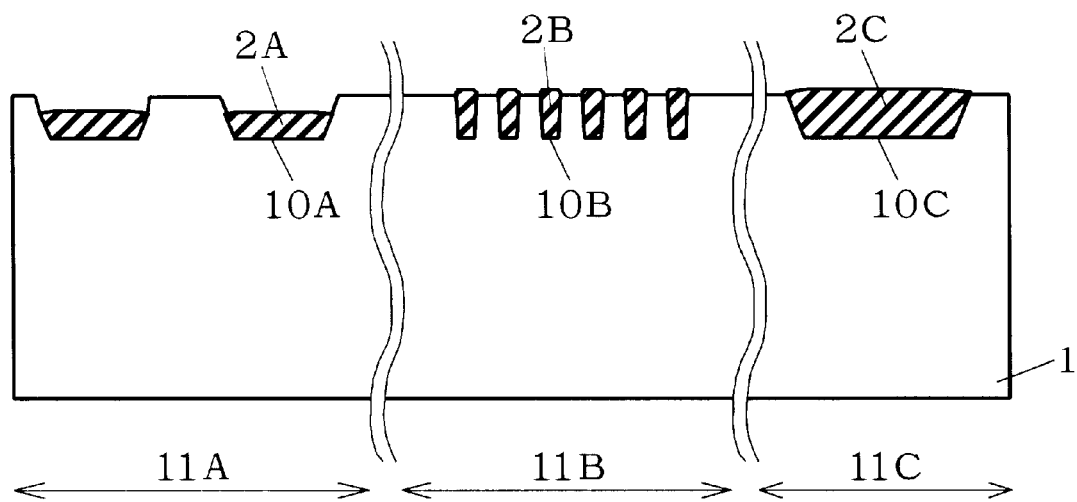
FIG. 1 shows a sectional structure of a semiconductor device (DRAM) according to a first preferred embodiment of the present invention.

FIG. 1 shows a sectional structure of a semiconductor device according to a first preferred embodiment of the present invention. In a silicon substrate 1, silicon oxide films 2A through 2C are embedded in trenches 10A through 10C, respectively, as shown in FIG. 1. More specifically, the embedded silicon oxide film 2A is formed in an alignment mark region 11A, the relatively narrow embedded silicon oxide film 2B in a memory cell region 11B, and the relatively wide embedded silicon oxide film 2C in a peripheral circuit region 11C.

Here, while surfaces of the silicon oxide films 2B and 2C embedded in the trenches 10B and 10C of an element forming region (memory cell region 11B and peripheral circuit region 11C), respectively, is a little higher than or almost level with the surface of the semiconductor substrate 1, the surface of the silicon oxide film 2A embedded in the trench 10A is lower than that.

In a DRAM of such structure of the first preferred embodiment, a difference in level is provided between the surface of the silicon oxide film 2A and the surface of the semiconductor substrate by forming the silicon oxide film 2A much lower than the surface of the semiconductor substrate 1, so that the difference in level is reflected to a gate electrode material to be formed thereon.

The difference in level of the gate electrode material facilitates detection of an alignment mark in patterning of a gate electrode, forming a resist pattern and patterning the gate electrode both with high positional accuracy. In this case, enough accuracy in alignment can be obtained with step height of over 30 nm between the embedded silicon oxide film 2A and the semiconductor substrate 1.

On the other hand, the surface of the embedded silicon oxide films 2B and 2C, formed in the element forming region (memory cell region 11B and peripheral circuit region 11C) at the same time with the embedded silicon oxide film 2A, are almost level with the surface of the semiconductor substrate 1. Thus, in this case, there is no disadvantage that electric field concentration from the gate electrode 14 causes hump in current/voltage characteristics of a transistor and increases threshold voltage and variations in current in the stand-by condition, and further that the electrode material remains in the edge in electrode etching and reduces yield of elements.

Moreover, as the embedded silicon oxide film 2A is formed in a lower portion of the trench 10A and thus its upper portion is completely exposed, a sharp configuration of edge in the surface of the trench 10A is reflected as a difference in level between the surface of the silicon oxide film 2A and the surface of the semiconductor substrate 1. This enables high accuracy in alignment. 1-2. First Manufacturing Method FIGS. 2 through 8 are sectional views illustrating a manufacturing method of the DRAM according to the first preferred embodiment.

Figure 2:
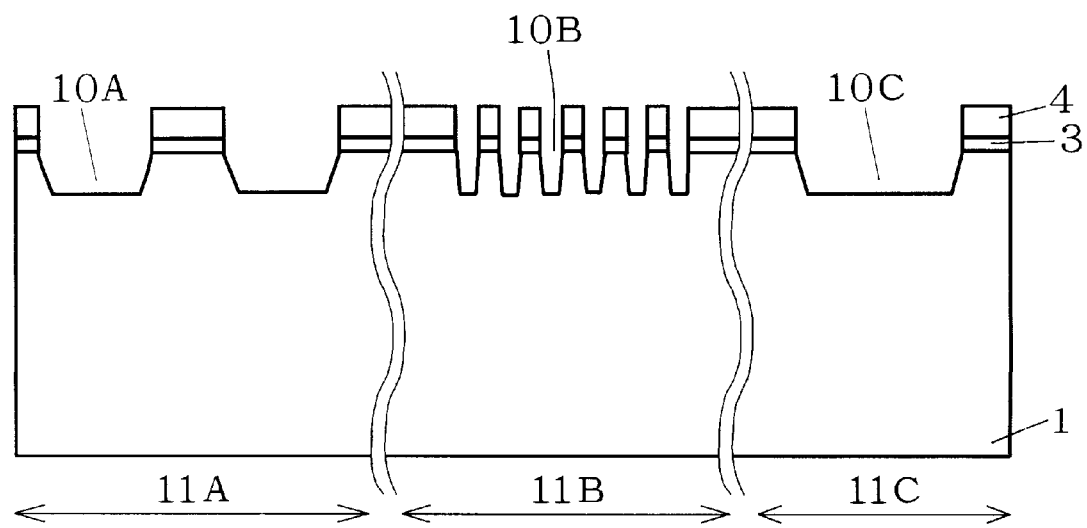
FIGS. 2 through 8 are sectional views illustrating a first manufacturing method according to the first preferred embodiment.

A silicon oxide film 3 of about 10 to 30 nm thick is formed on the semiconductor substrate 1 by thermal oxidation, and a silicon nitrogen film 4 of about 50 to 250 nm thick is deposited thereon by a LPCVD method as shown in FIG. 2. Then, the silicon nitrogen film 4 and the silicon oxide film 3 in a predetermined area prescribed by photolithography are removed by dry etching to form trenches 10 (10A through 10C) in depth ranging from 200 to 500 nm in the semiconductor substrate 1. More specifically, a relatively wide trench 10A is formed in the alignment mark region 11A, a relatively narrow trench in the memory cell region 11B, and a relatively wide trench 10C in the peripheral circuit region 11C.

Figure 3:
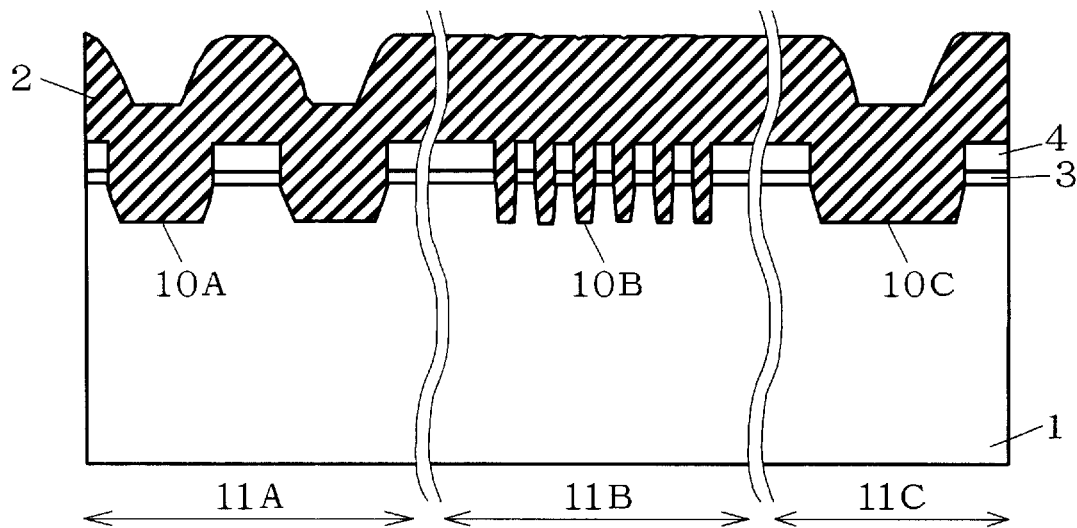

After an oxide film of 5 to 30 nm thick is formed in side and bottom faces of the trenches 10 by thermal oxidation, the silicon oxide film 2 is deposited thereon in thickness ranging from 500 nm to 1u m by the LPCVD method as shown in FIG. 3. At this time, while film thickness on the wide trenches 10A and 10C is proportional to what is actually deposited thereon along the shape of those trenches, film thickness on the narrow trench 10B is thicker than what is actually deposited thereon because the trench 10B has been filled by the silicon oxide film 2 in the early deposition.

Thus, there is more silicon oxide film 2 to be removed on the trench 10B than on the trench 10C, which requires another step for selectively removing the silicon oxide film 2 on the trench 10B of the memory cell region 11B.

Figure 4:
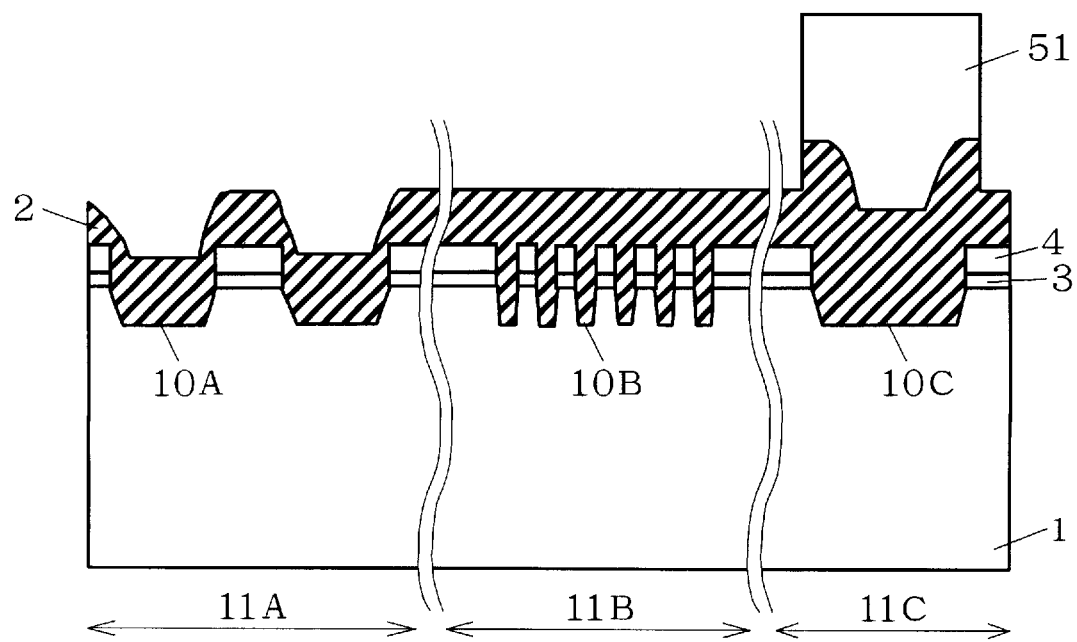

In order to reduce absolute difference in level, as shown in FIG. 4, a resist pattern 51 is formed only on the trench 10C by photolithography and the silicon oxide film 2 is removed in thickness ranging from 300 to 500 nm by dry etching. At this time, the resist pattern 51 is not formed on the trench 10A of the alignment mark region 11A, though the trench 10A is as wide as the trench 10C. Thus, the silicon oxide film 2 formed on the trenches 10B and 10A and a part of the silicon oxide film 2 filled in the trench 10A are simultaneously removed in the step of FIG. 4.

Figure 5:
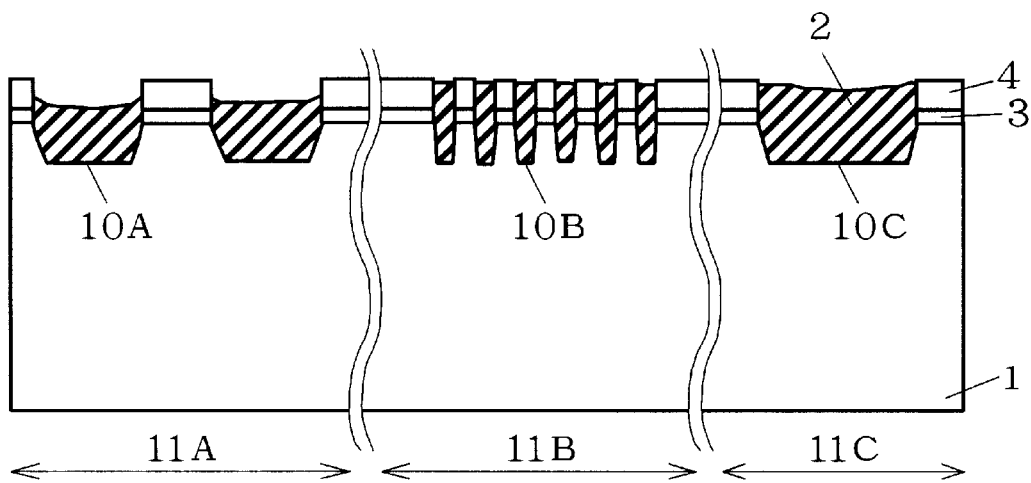

After the resist pattern 51 is removed, the silicon oxide film 2 formed on the silicon nitrogen film 4 and a part of the silicon oxide film 2 filled in the trenches 10A through 10C are removed by the CMP method as shown in FIG. 5. The silicon oxide film in the trench 10A of the alignment mark region 11A is thinner than that in the trenches 10B and 10C of the element forming region before the CMP, which does not change after the polishing.

Figure 6:
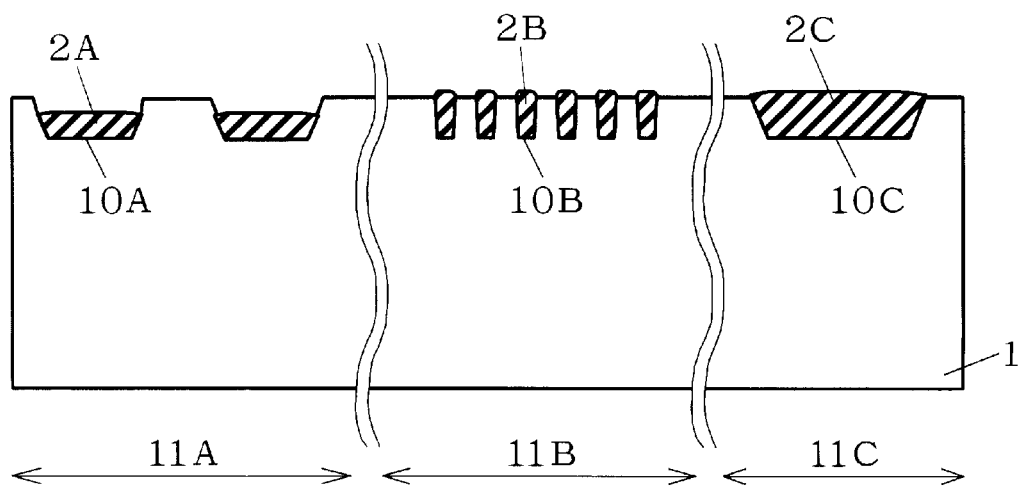

As shown in FIG. 6, the silicon nitrogen film 4 is removed with phosphoric acid, and the silicon oxide film 3 and a part of the silicon oxide film 2 is removed with hydrofluoric acid, to form an embedded silicon oxide film 2A in the alignment mark region 11A, an embedded silicon oxide film 2B in the memory cell region 11B, and an embedded silicon oxide film 2C in the peripheral circuit region 11C, completing the trench-type element isolation structure. While the surface of the embedded oxide films 2B and 2C of the element forming region (11B, 11C) are almost level with the surface of the semiconductor substrate 1, the surface of the silicon oxide film 2A embedded in the trench 10A of the alignment mark region 11A is about 300 to 500 nm lower than the surface of the semiconductor substrate 1.

Figure 7:
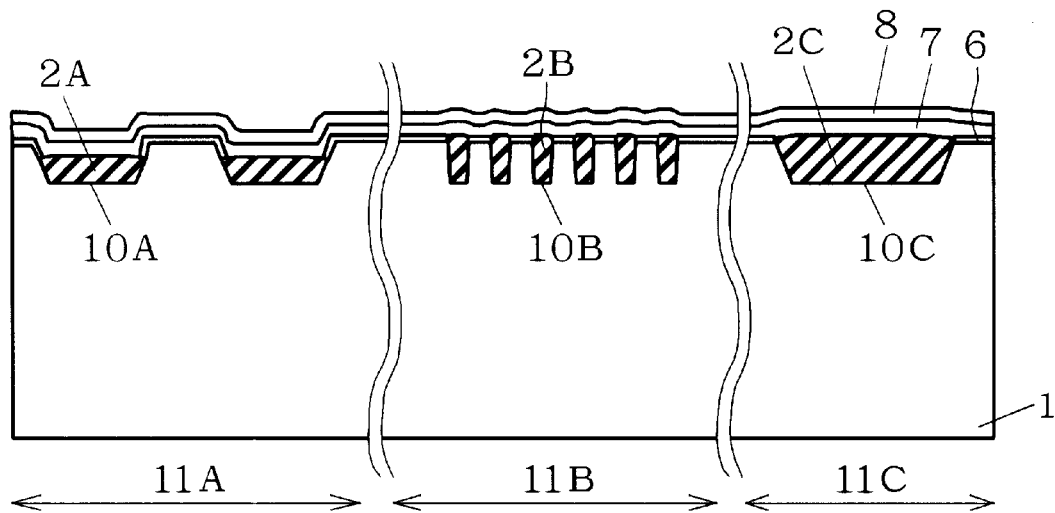

Then, a gate oxide film 6 of about 4 to 10 nm thick is formed by thermal oxidation, and a polysilicon film 7 of about 50 to 150 thick doped with phosphorus and a tungsten silicide film 8 of about 50 to 150 nm thick are deposited thereon, as shown in FIG. 7.

Figure 8:
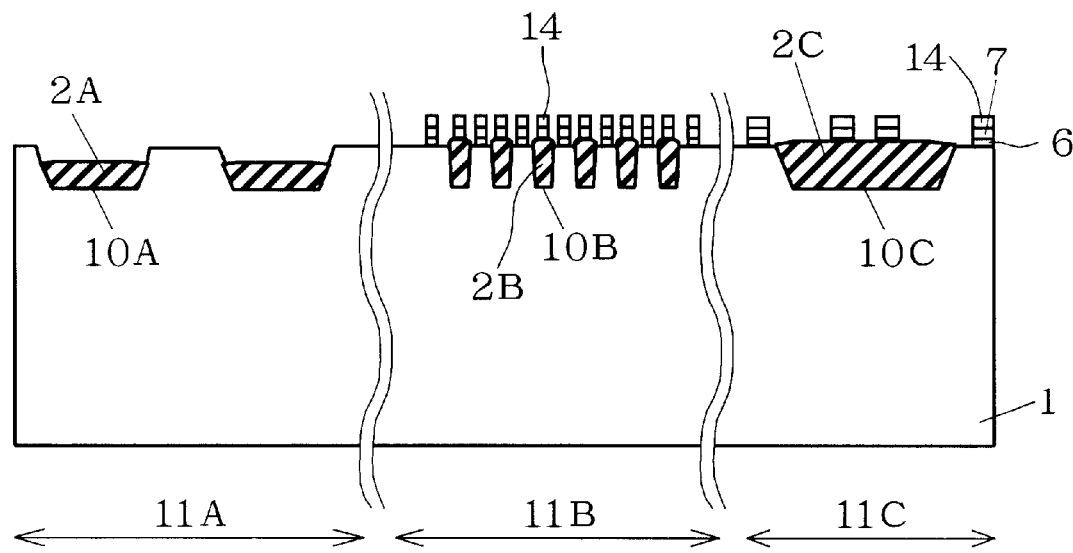

Next, an alignment processing is performed to form a pattern for superimposing a gate electrode on the element isolation region by photolithography with an alignment mark (embedded silicon oxide film 2A) formed in the forming process of the element isolation structure. In the processing, the tungsten silicide film 8 and the polysilicon film 7 are partly removed by dry etching to form a gate electrode 14 as shown in FIG. 8.

At this time, the surface of the embedded silicon oxide films 2B and 2C of the element forming region are about level with the surface of the semiconductor substrate 1. Thus, the electrode material hardly remains in the edges of both the trenches 10B and 10C in formation of the gate electrode 14, improving yield of elements.

As a layered structure consisting of the polysilicon film 7 and the tungsten silicide film 8 does not transmit light, it is impossible to directly recognize picture information of the embedded silicon oxide film 2A in the alignment processing. However, as the difference in level between the surface of the embedded silicon oxide film 2A and the surface of the semiconductor substrate 1 is reflected to the surface of the tungsten silicide film 8 to be formed thereon as shown in FIG. 7, both the first method for detecting a mark by diffracted light and the second method for detecting a mark by picture recognition can be adopted to perform the alignment mark processing with high accuracy.

Likewise, the first electrode material for forming the gate electrode 14 does not transmit light even if formed of a layered structure consisting of polysilicon and metal, or a metal. This, however, does not matter because the difference in level between the surface of the embedded silicon oxide film 2A and the surface of the semiconductor substrate 1 is reflected to the surface of the first electrode material to be formed thereon.

Figure 9:
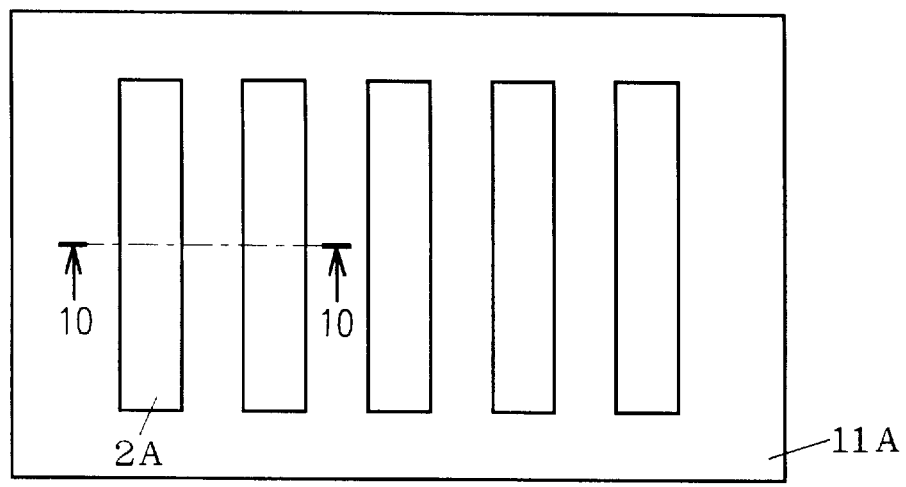
FIG. 9 is a plan view showing a plane structure of an alignment mark region 11A

FIG. 9 shows a plane structure of the alignment mark region 11A. This figure shows that the rectangular silicon oxide film 2A is formed in the alignment mark region 11A. A section taken along a line A—A in this figure is shown in FIG. 8. When long and short sides of the embedded silicon oxide film 2A are L1 and L2, respectively, and the length of the short sides L2 is two times longer than the depth of the trench 10A, the embedded silicon oxide film 2A structured as shown in FIG. 8 can be relatively easily obtained.

Figure 10:
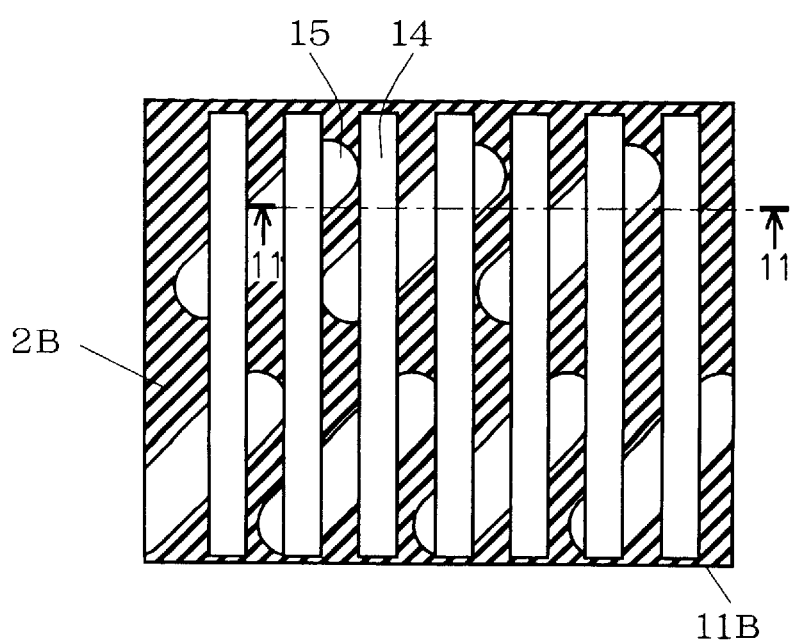
FIG. 10 is a sectional view showing a plane structure of a memory cell 11B.
Figure 11:
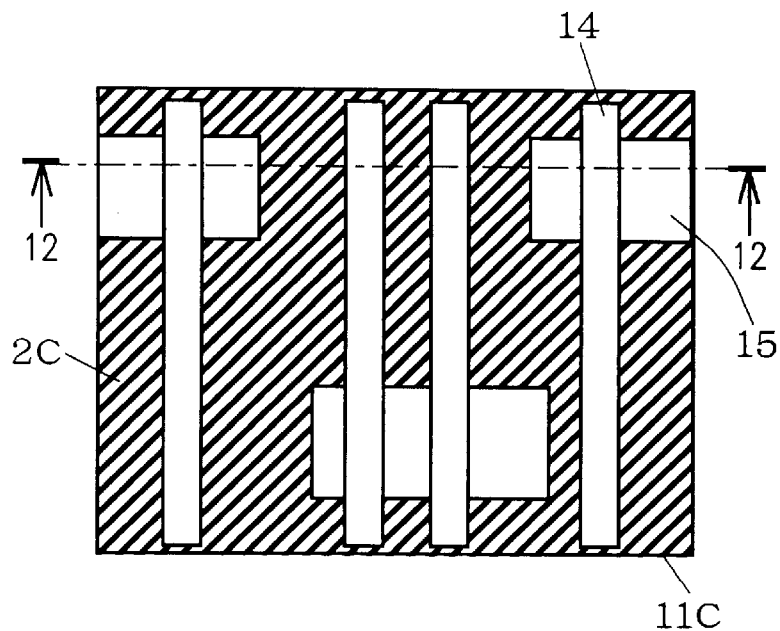
FIG. 11 is a sectional view showing a plane structure of a peripheral circuit region 11C.

FIG. 10 shows a plane structure of the memory cell region 11B. In this figure, the reference numeral 15 indicates an active region, and the section taken along a line B—B is shown in FIG. 8. FIG. 11 shows a plane structure of the peripheral circuit region 11C. A section taken along a line C—C in the figure is shown in FIG. 8.

After the above-described process, a standard processing for forming a bit line, a capacitor, a wire layer formed of aluminum, and the like are performed to complete the DRAM.

Consequently, according to this preferred embodiment, a high performance DRAM can be manufactured through highly accurate alignment processing without any additional steps compared to the conventional manufacturing method.

1-3. Embedded Silicon Oxide Film in Element Forming Region

Figure 12:
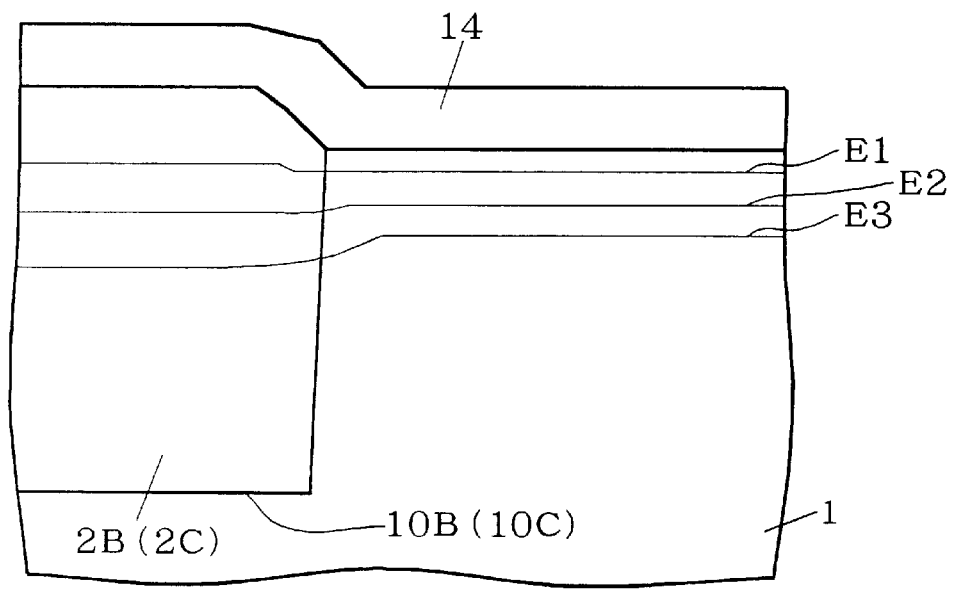
FIGS. 12 and 13 are sectional views used for describing an effect of the first preferred embodiment.

Strictly speaking, the surface of the embedded silicon oxide films 2B (2C) of the DRAM according to the first preferred embodiment is a little higher than the surface of the semiconductor substrate 1 as shown in FIG. 12.

Figure 13:
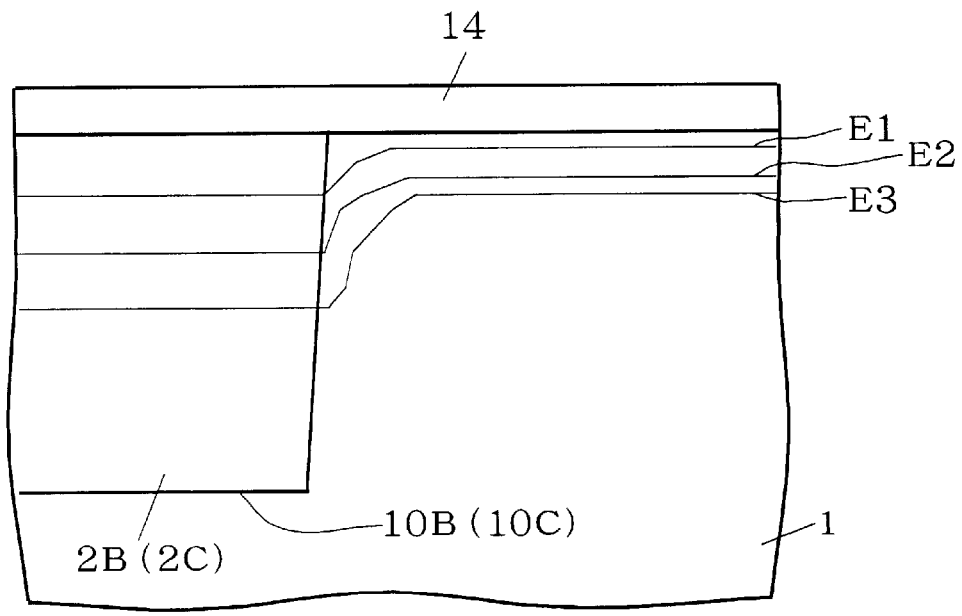
Figure 14:
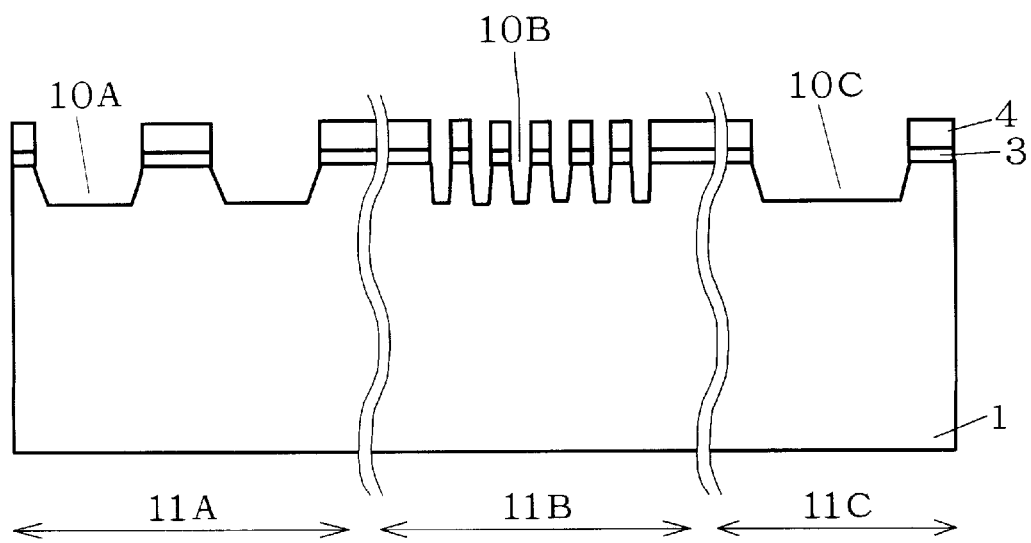
FIGS. 14 through 21 are sectional views illustrating a second manufacturing method according to the first preferred embodiment.
Figure 15:
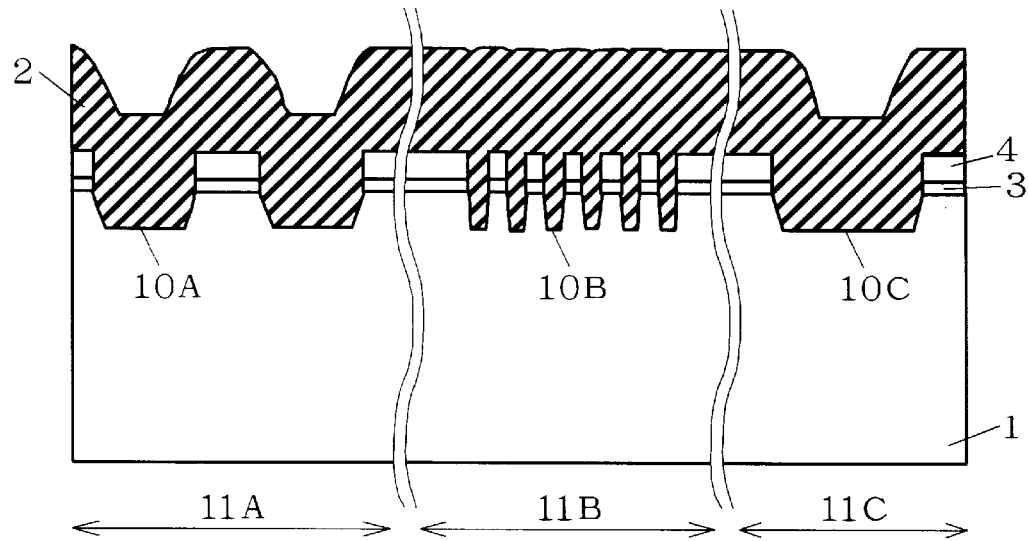

When the surface of the embedded silicon oxide film 2B is level with the surface of the semiconductor substrate 1 as shown in FIG. 13, electric field concentration is caused in edges of the surface of the trench 10B as indicated by coverage contours E1 through E3, depending on difference in the degree of transmission of electric field from the gate electrode 14 between the semiconductor substrate 1 and the embedded silicon oxide film 2B.

In such structure of the first preferred embodiment, the degree of difference in level between the embedded silicon oxide film 2B and the semiconductor substrate is determined so as to reduce difference in degree of transmission of electric field, generated from the gate electrode 14 when gate voltage is applied to the gate electrode 14, between the semiconductor substrate 1 and the embedded silicon oxide film 2B. This leads to uniform distribution of electric field as indicated by coverage contours E1 through E3 of FIG. 12.

This effect is especially effective for the memory cell region 11B formed in the relatively narrow trench 10B.

1-3. Second Manufacturing Method

FIGS. 14 through 21 are sectional views illustrating a second manufacturing method of the DRAM according to the first preferred embodiment. Now, the second manufacturing method will be described in detail, referring to those figures.

The process illustrated in FIGS. 14 through 17 proceeds as in the conventional process illustrated in FIGS. 41 through 44, so that their description will be omitted.

Figure 18:
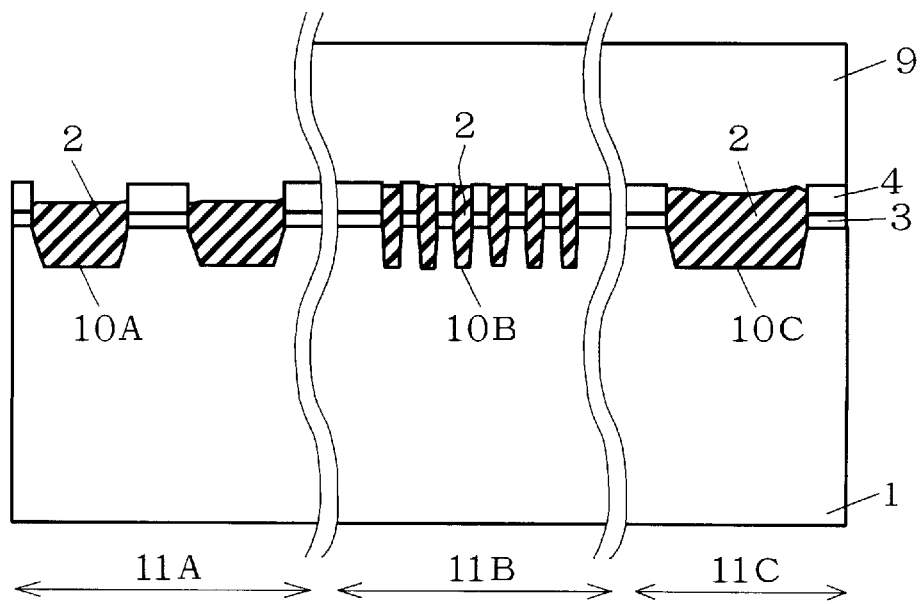

After the process shown in FIGS. 14 through 17, a second resist pattern 9 is formed to cover the element forming region including the memory cell region 11B and the peripheral circuit region 11C, and an upper portion of the embedded silicon oxide film 2A in the alignment mark region 11A is partly removed with hydrofluoric acid using the silicon nitrogen film 4 as a mask, as shown in FIG. 18. In this step, the use of hydrofluoric acid may be substituted by dry etching.

Figure 19:
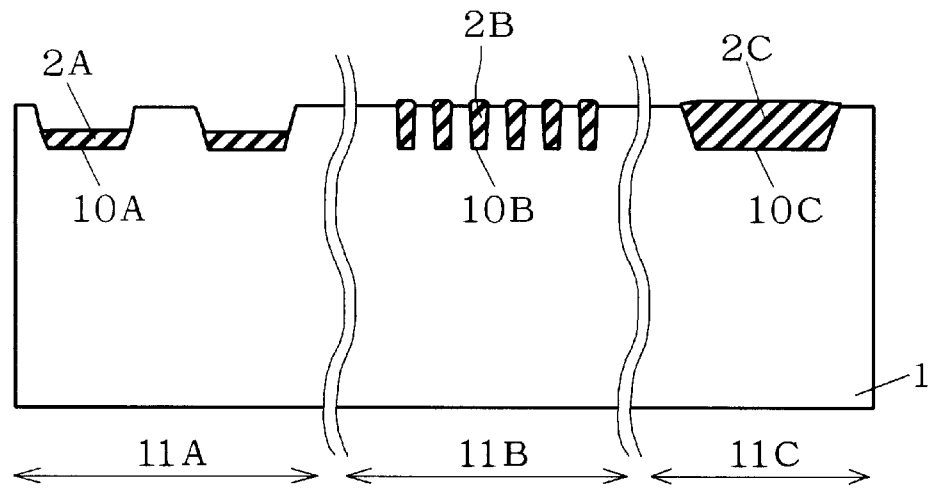
Figure 20:
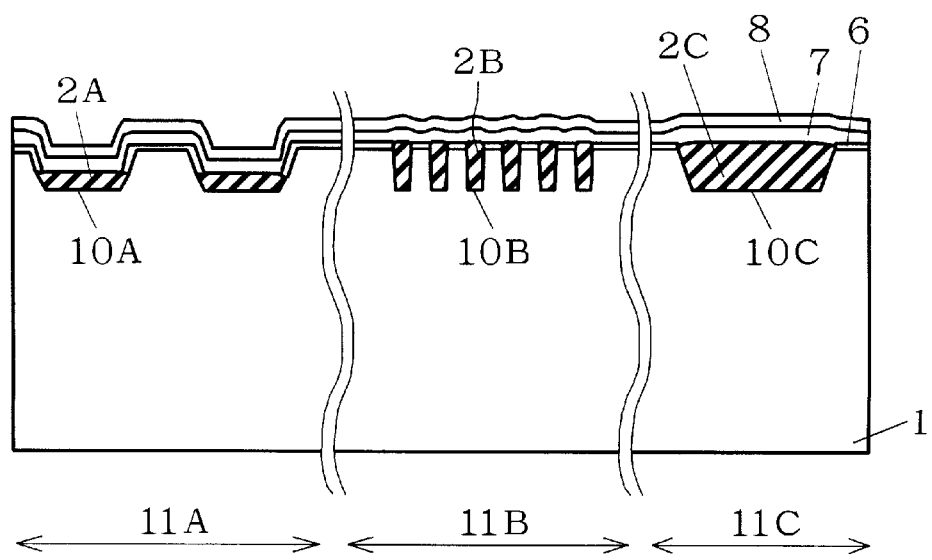
Figure 21:
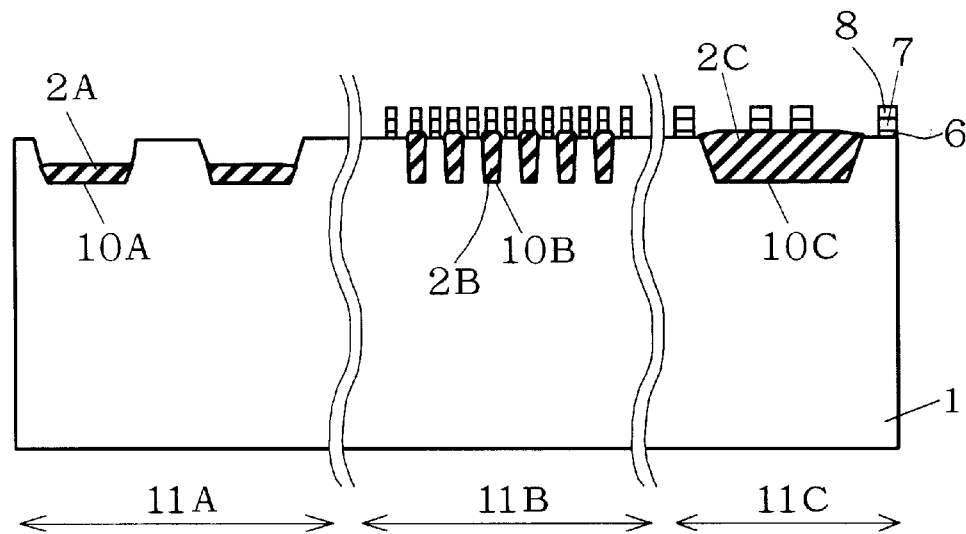

The process shown in FIGS. 19 through 21 proceeds just as described in the first manufacturing method shown in FIGS. 6 through 8.

Though the second manufacturing method includes one more process compared to the first manufacturing method, the process shown in FIG. 18 is for removing only the silicon oxide film 2 in the alignment mark region 11A, and has an advantage that the step height between the embedded silicon oxide film 2 and the semiconductor substrate 1 is arbitrarily determined.

Figure 16:
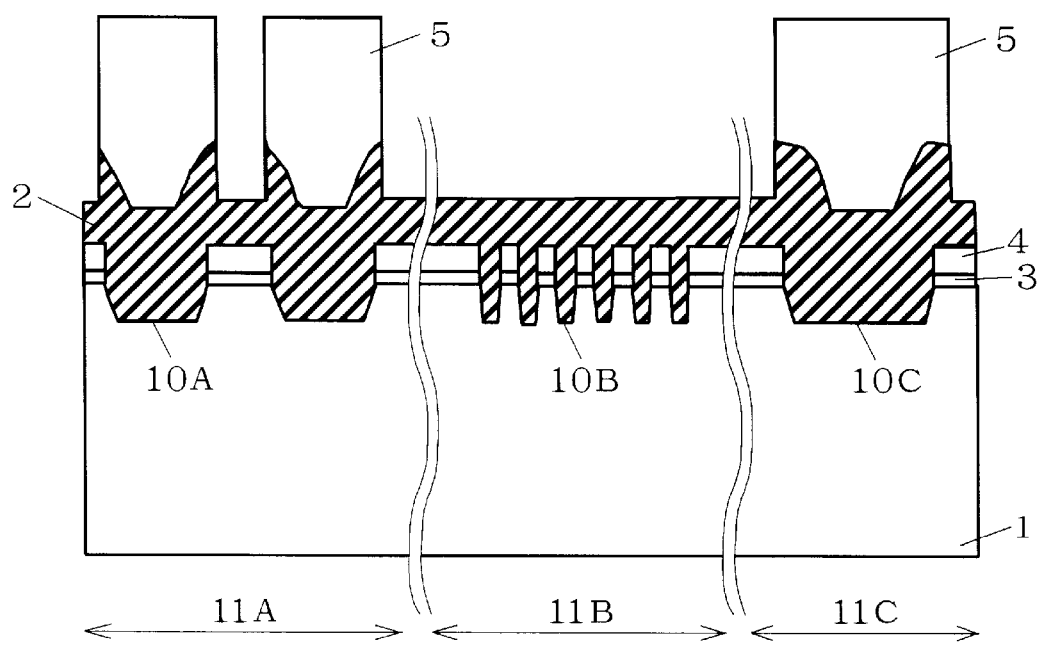
Figure 17:
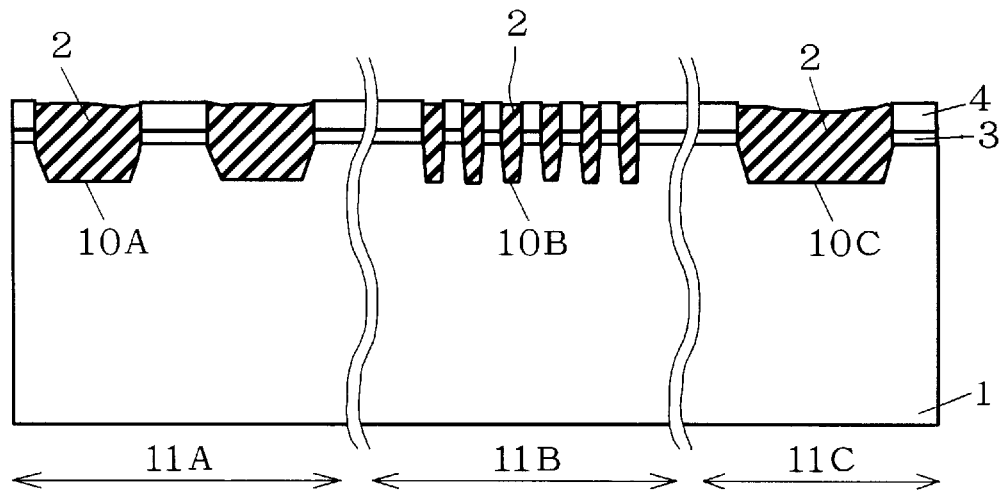

Further, according to the second manufacturing method, formation of the resist pattern and dry etching both for reducing absolute difference in level as shown in FIG. 16 are not performed in the trench 10A of the alignment mark region 11A. However, dry etching may be performed in the trench 10A of the alignment mark region 11A as described in the first manufacturing method shown in FIG. 4 to form the silicon oxide film 2 in the trench 10A further lower than the surface of the semiconductor substrate. In that case, the difference in level between the embedded silicon oxide film 2A and the semiconductor substrate 1 increases, facilitating detection of an alignment mark.

2. Second Preferred Embodiment 2-1. Structure

Figure 22:
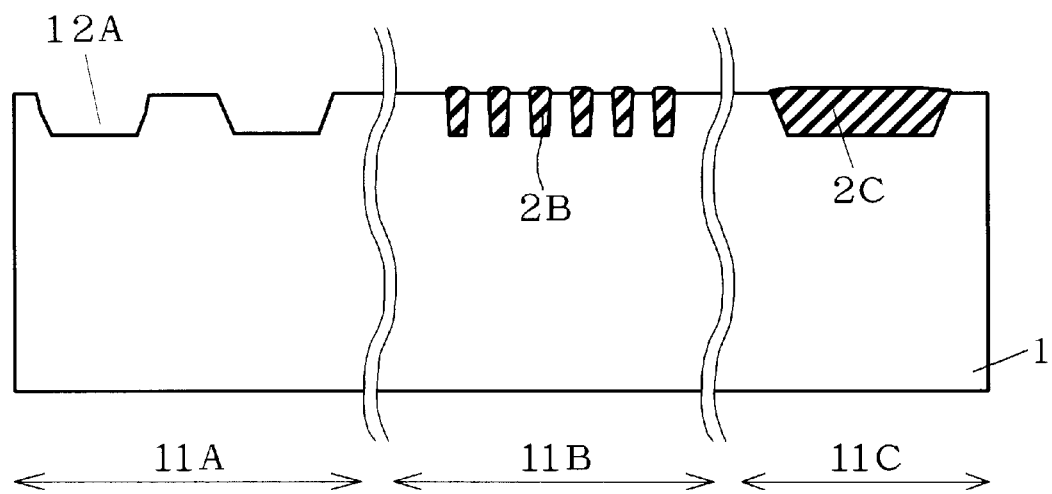
FIG. 22 shows a sectional structure of a semiconductor device (DRAM) according to a second preferred embodiment of the present invention.
Figure 23:
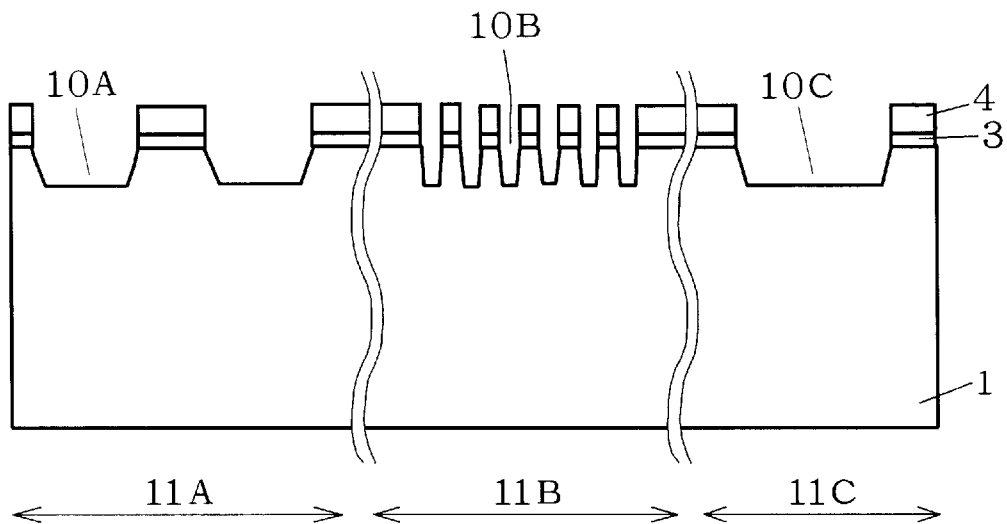
FIGS. 23 through 30 are sectional views illustrating a manufacturing method according to the second preferred embodiment.
Figure 24:
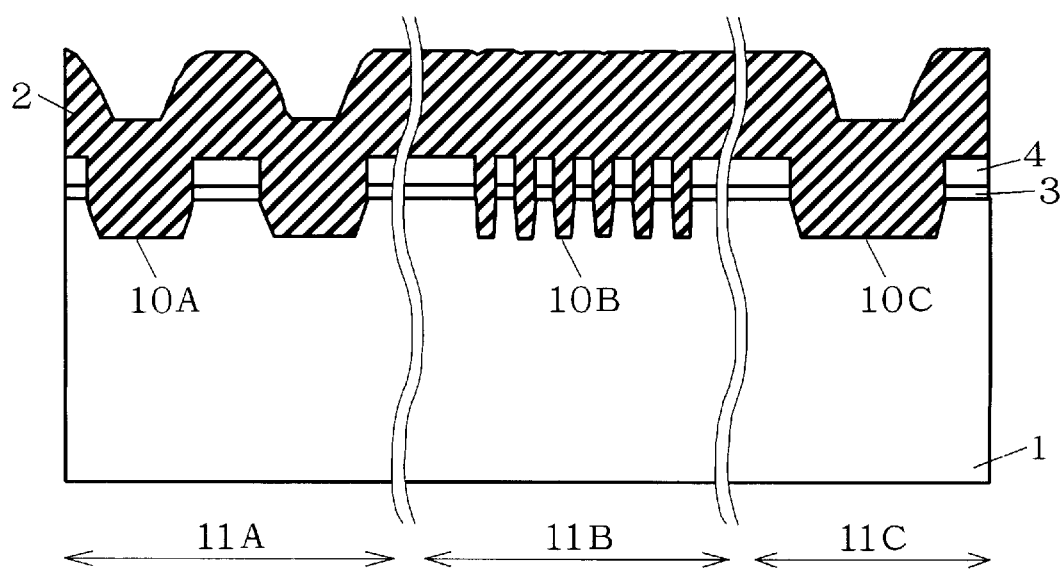

FIG. 22 shows a sectional structure of a semiconductor device according to a second preferred embodiment of the present invention. In the semiconductor substrate 1, the silicon oxide films 2B and 2C are embedded in the trenches 10B and 10C, respectively, while no silicon oxide film is formed in the trench 10A, as shown in FIG. 22. More specifically, a completely exposed trench 10A is formed in the alignment mark region 11A, a relatively narrow embedded silicon oxide film 2B in the memory cell region 11B and a relatively wide embedded silicon oxide film 2C in the peripheral circuit region 11C.

Here, the surface of the silicon oxide films 2B and 2C embedded in the trenches 10B and 10C of the element forming region (memory cell region 11B and peripheral circuit region 11C), respectively, are almost level with the surface of the semiconductor substrate 1. On the other hand, the bottom of the trench 10A is much lower than the surface of the semiconductor substrate 1.

In the DRAM of such structure of the second preferred embodiment, a difference in level is provided on the surface of the semiconductor substrate by forming the surface of the embedded silicon oxide film 2A lower than the surface of the semiconductor substrate, and the difference in level is reflected to the surface of the gate electrode to be formed thereon.

As the result, the difference in level of the gate electrode material facilitates detection of the alignment mark in patterning of the gate electrode, forming a resist pattern and patterning the gate electrode both with high positional accuracy. In this case, enough accuracy in alignment can be obtained with difference in level of over 30 nm between the bottom of the trench 10A and the semiconductor substrate 1.

2-2. Manufacturing Method

FIGS. 23 through 30 are sectional views illustrating a manufacturing method according to the second preferred embodiment. Now, the manufacturing method will be described in detail, referring to those figures.

The process shown in FIGS. 23 through 26 proceeds as in the process of the second manufacturing method according to the first preferred embodiment shown in FIGS. 14 through 17 (corresponding to the conventional method shown in FIGS. 41 through 44), so that their description will be omitted.

Figure 27:
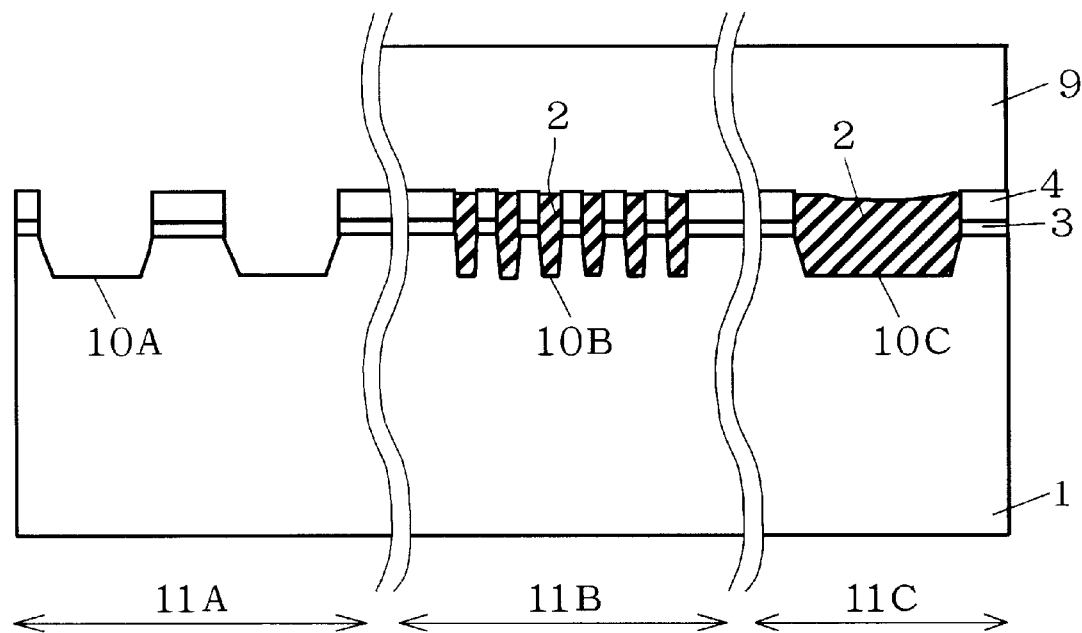

After the process shown in FIGS. 23 through 26, a second resist pattern 9 is formed to cover the element forming region including the memory cell region 11B and the peripheral circuit region 11C, and the embedded silicon oxide film 2A in the alignment mark region 11A is all removed with hydrofluoric acid using the silicon nitrogen film 4 as a mask, as shown in FIG. 27. In this step, the use of hydrofluoric acid may be substituted by dry etching.

Figure 28:
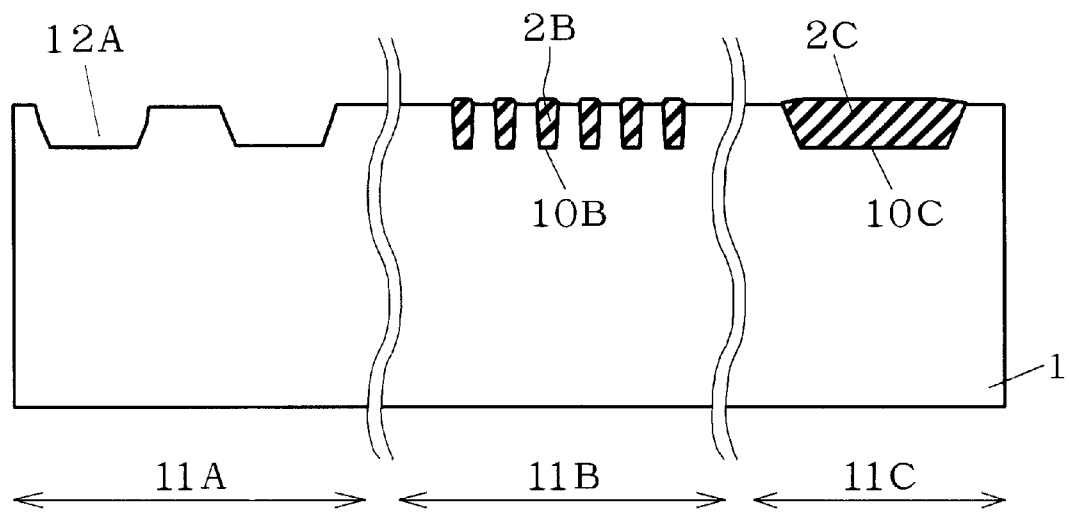
Figure 29:
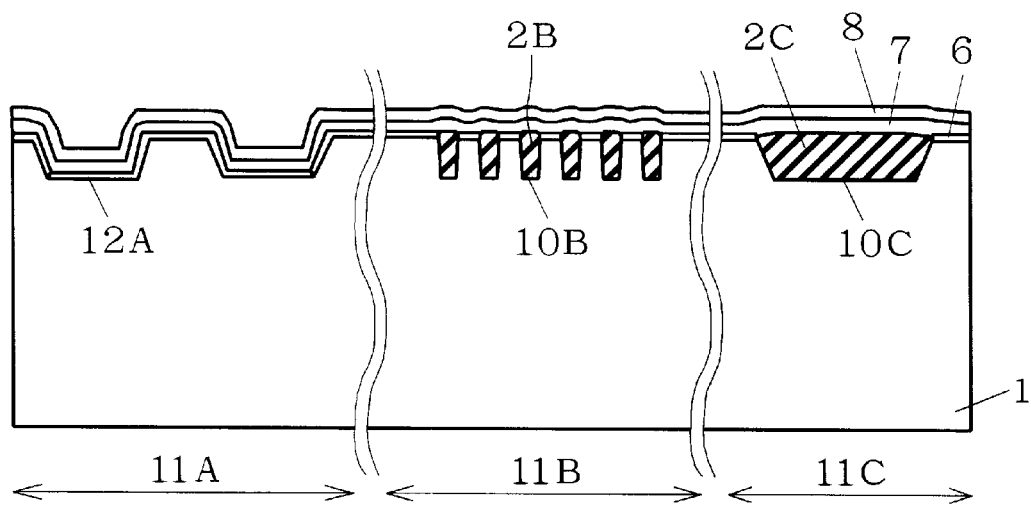
Figure 30:
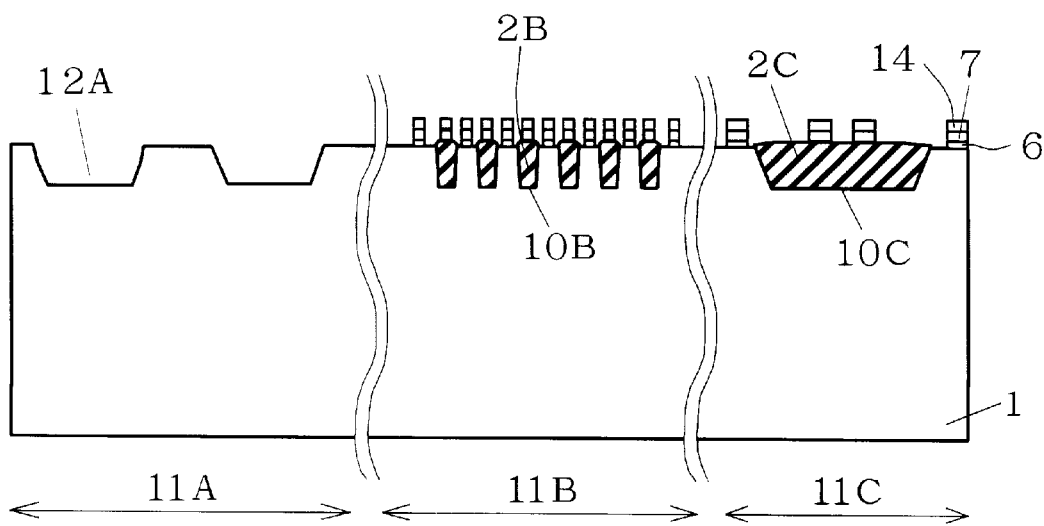

The process shown in FIGS. 28 through 30 proceeds just as described in the second manufacturing method of the first preferred embodiment with reference to FIGS. 19 through 21 (or in the first manufacturing method shown in FIGS. 6 through 8).

Figure 25:
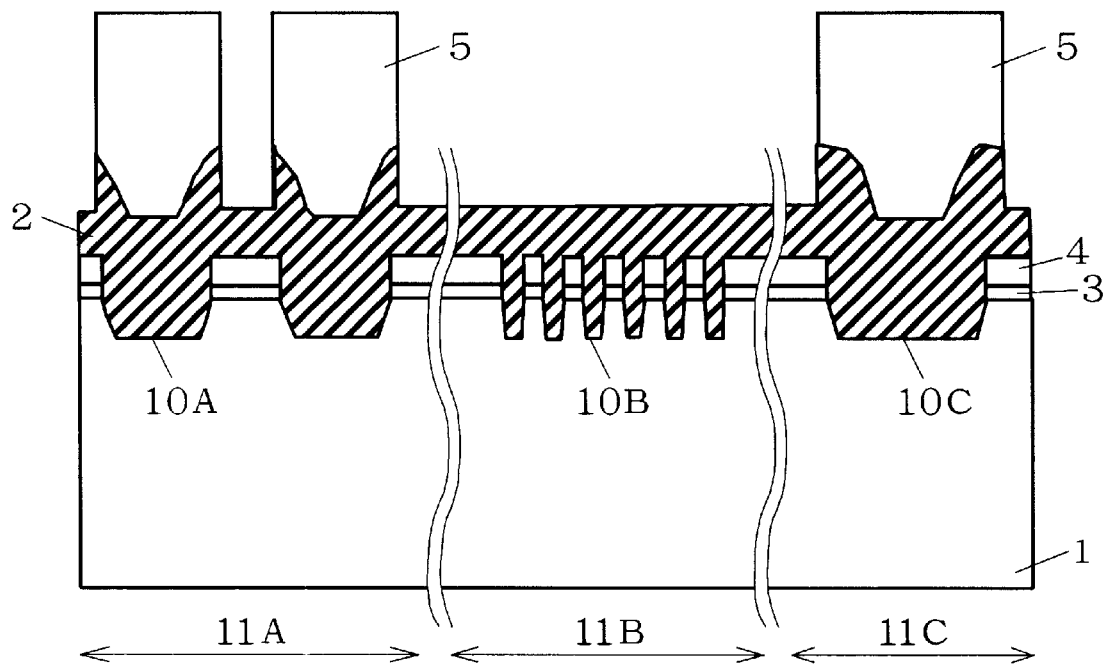
Figure 26:
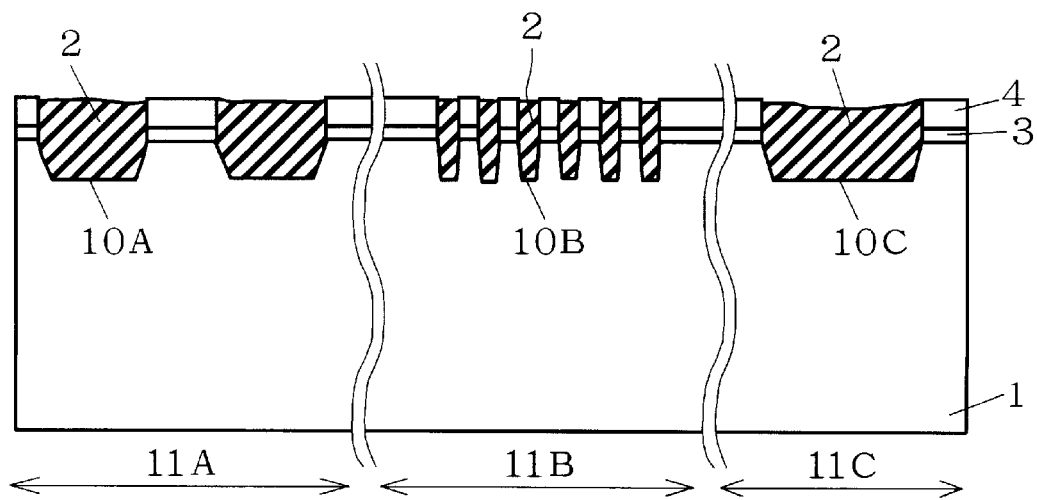

According to the manufacturing method of the second preferred embodiment, formation of a resist pattern and dry etching both for reducing the absolute difference in level shown in FIG. 25 are not performed in the trench 10A of the alignment mark region 11A. However, dry etching may be performed in the trench 10A of the alignment mark region 11A, as described in the first manufacturing method of the first preferred embodiment shown in FIG. 4, to form the silicon oxide film 2 in a lower portion to some extent in the trench 10A at this stage.

3. Third Preferred Embodiment 3-1. Structure

Figure 31:
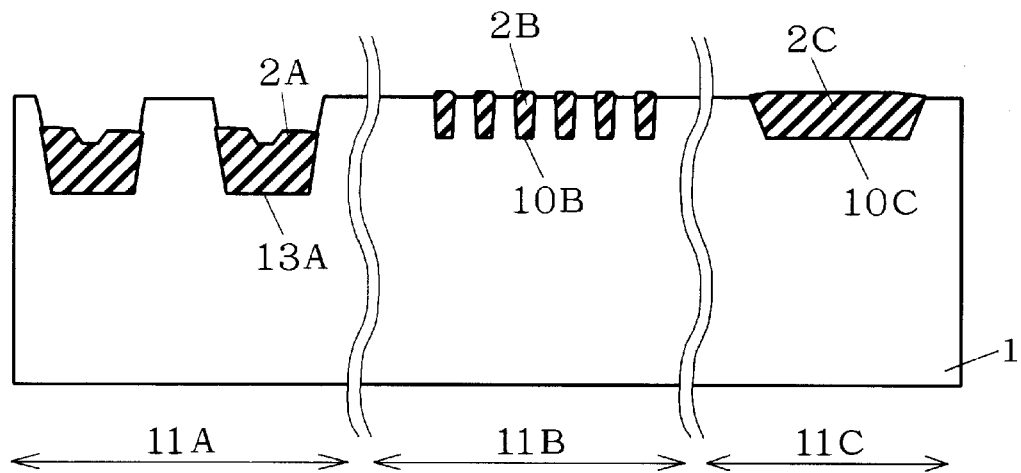
FIG. 31 shows a sectional structure of a semiconductor device (DRAM) according to a third preferred embodiment of the present invention.

FIG. 31 shows a sectional structure of a semiconductor device according to a third preferred embodiment of the present invention. In the semiconductor substrate 1, the silicon oxide films 2A, 2B and 2C are embedded in trenches 13A, 10B and 10C, respectively. More specifically, the embedded silicon oxide film 2A is formed in the alignment mark region 11A, the relatively narrow embedded silicon oxide film 2B in the memory cell region 11B, and the relatively wide embedded silicon oxide film 2C in the peripheral circuit region 11C.

The surface of the silicon oxide films 2B and 2C embedded in the trenches 10B and 10C of the element forming region (memory cell region 11B and the peripheral circuit region 11C), respectively, are almost level with the surface of the semiconductor substrate 1. On the other hand, the surface of the silicon oxide film 2A embedded in the trench 13A is lower than the surface of the semiconductor substrate 1.

In the DRAM of such structure of the third preferred embodiment, a difference in level is provided on the surface of the semiconductor substrate by forming the surface of the embedded silicon oxide film 2A lower than the surface of the semiconductor substrate, and the difference in level is reflected to the surface of the gate electrode material to be formed thereon.

As the result, the difference in level of the gate electrode material facilitates detection of the alignment mark in patterning of the gate electrode, forming a resist pattern and patterning the gate electrode both with high positional accuracy. In this case, enough accuracy in alignment can be obtained with difference in level of over 30 nm between the embedded silicon oxide film 2A and the semiconductor substrate 1.

On the other hand, the surface of the embedded silicon oxide films 2B and 2C, formed in the element forming region (memory cell region 11B and peripheral circuit region 11C) at the same time with the embedded silicon oxide film 2A, are almost level with the surface of the semiconductor substrate 1. Thus, in this case, there is no disadvantage that electric field concentration from the gate electrode 14 causes hump in current/voltage characteristics of a transistor and increases threshold voltage and variations in current in the stand-by condition, and further that the electrode material remains in the edge in electrode etching and reduces yield of elements.

Moreover, as the embedded silicon oxide film 2A is formed in a lower portion of the trench 13A and thus its upper portion is completely exposed, a sharp configuration of the edge in the surface of the trench 13A is reflected to a difference in level between the surface of the silicon oxide film 2A and the surface of the semiconductor substrate 1. This enables high accuracy in alignment.

3-2. Manufacturing Method

FIGS. 32 through 39 are sectional views illustrating a manufacturing method according to the third preferred embodiment. Now, the manufacturing method will be described in detail, referring to those figures.

Figure 32:
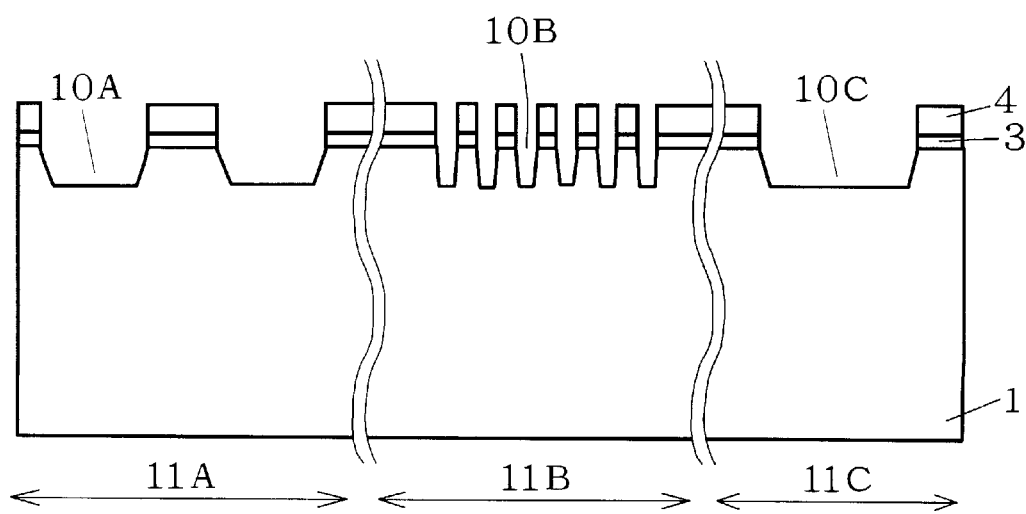
FIGS. 32 through 39 are sectional views illustrating a manufacturing method according to the third preferred embodiment.

The silicon oxide film 3 of 10 to 30 nm thick is formed on the semiconductor substrate 1 by thermal oxidation, and the silicon nitrogen film 4 of about 50 to 250 nm thick is deposited thereon by the LPCVD method as shown in FIG. 32. Then the silicon nitrogen film 4 and the silicon oxide film 3 in a predetermined area prescribed by photolithography is removed by dry etching to form the trenches 10 (10A through 10C) in depth ranging from 200 to 500 nm in the semiconductor substrate 1. More specifically, the relatively wide trench 10A is formed in the alignment mark region 11A, the relatively trench 10B in the memory cell region 11B, and the relatively wide trench 10C in the peripheral circuit region 11C.

Figure 33:
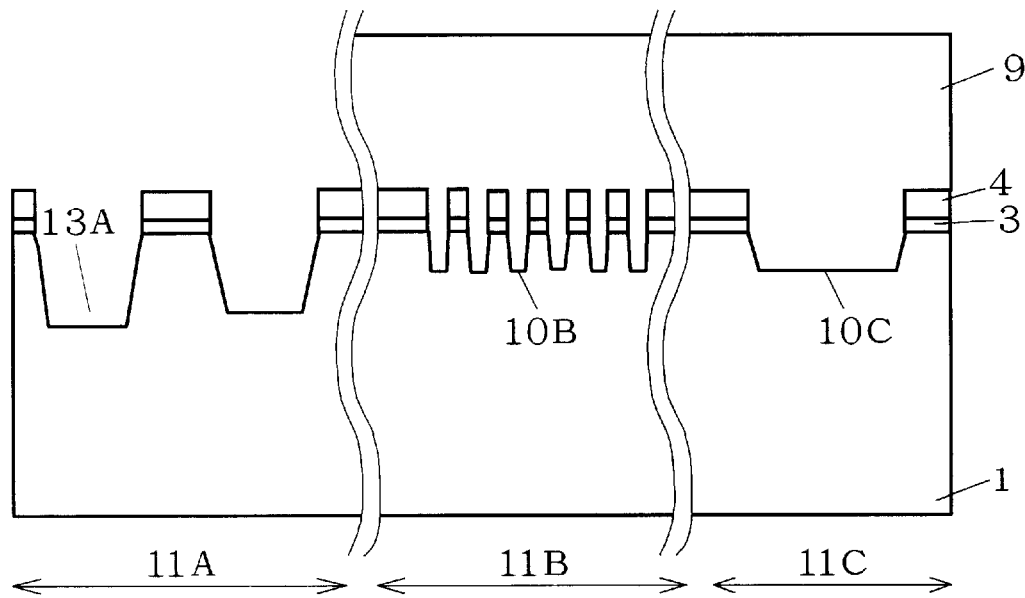

Then, as shown in FIG. 33, a resist pattern 9 is formed to cover the element forming region (memory cell region 11B and peripheral region 11C), and the trench 10A in the alignment mark region 11A is further deepened from 200 to 500 nm by dry etching, using the resist pattern 9 and the silicon nitrogen film 4 as masks, to form the trench 13A.

Figure 34:
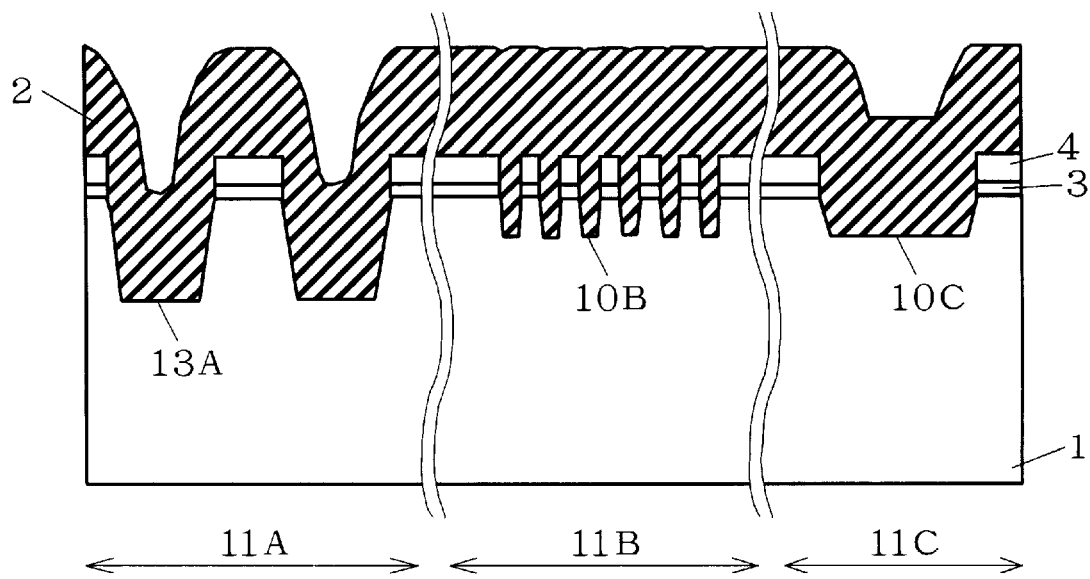

After an oxide film of 5 to 30 nm thick is formed in side and bottom faces of the trenches 13A, 10B and 10C by thermal oxidation, the silicon oxide film 2 is deposited thereon in thickness ranging from 500 nm to 1 μm by the LPCVD method as shown in FIG. 34. At this time, as the trench 13A is deeper than the trenches 10B and 10C, the surface of the silicon oxide film 2 deposited in the trench 13A is lower than that in the trenches 10B and 10C.

Figure 35:
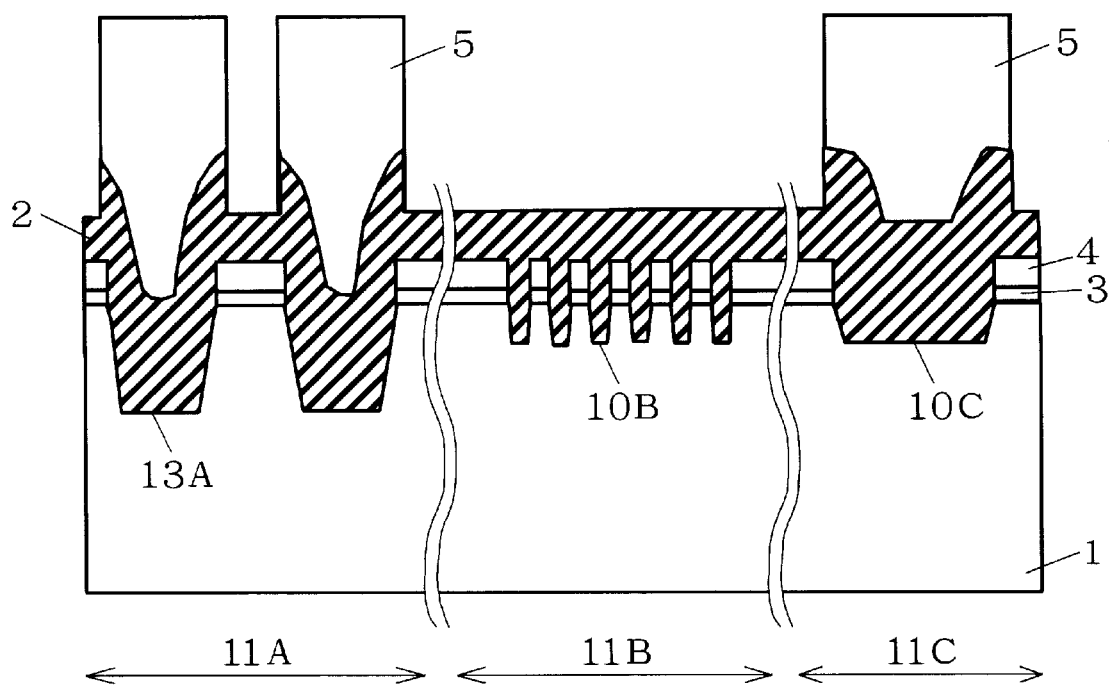

In order to reduce absolute difference in level, as show in FIG. 35, a resist pattern 5 is formed only on the wide trenches 13A and 10C by photolithography, and the silicon oxide film 2 is removed in thickness ranging from 300 to 500 nm by dry etching.

Figure 36:
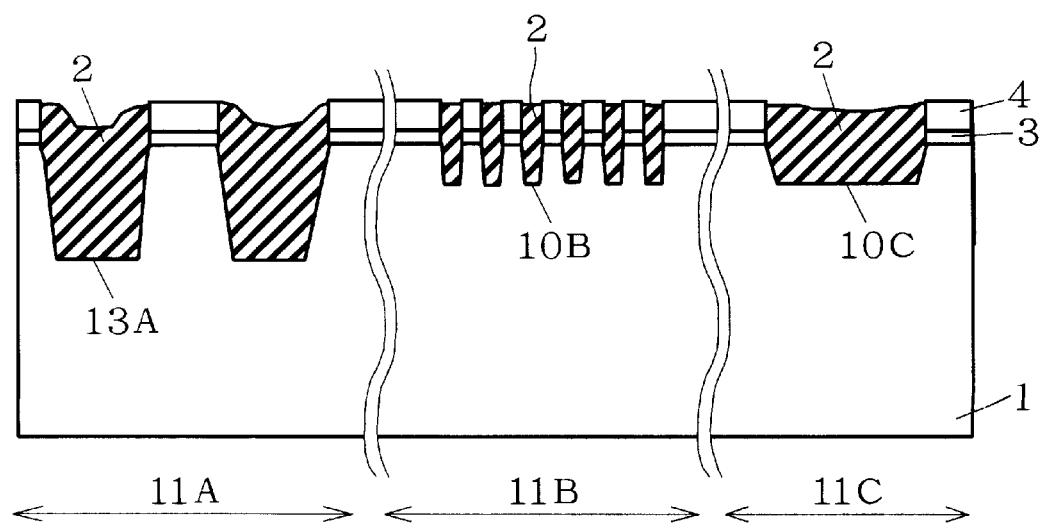

After the resist pattern 5 is removed, the silicon oxide film 2 formed on the silicon nitrogen film 4 and a part of the silicon oxide film 2 filled in the trenches 13A, 10B and 10C are removed by the CMP method as shown in FIG. 36 As the surface of the silicon oxide film 2 on the trench 13A of the alignment mark 11A is formed lower than that on the trenches 10B and 10C of the element forming region before the CMP, the difference in level still remains after the polishing.

Figure 37:
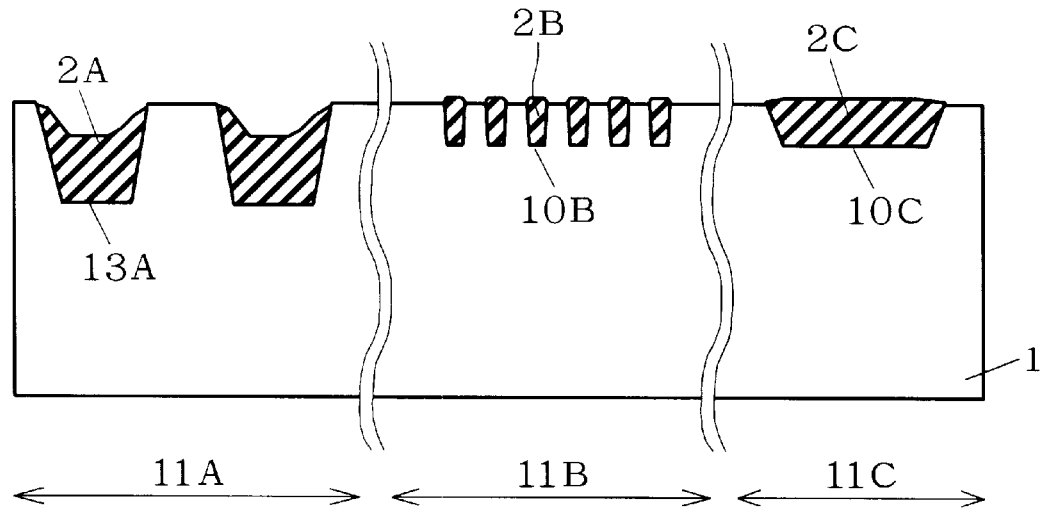

The silicon nitrogen film 4 is removed by using phosphoric acid, and the silicon oxide film 3 and a part of the embedded oxide film 2 are removed by using hydrofluoric acid, completing the trench-type element isolation structure, as shown in FIG. 37. At this time, while the surface of the embedded silicon oxide films 2B and 2C are almost level with the surface of the semiconductor substrate 1, the surface of the silicon oxide film 2A embedded in the trench 13A of the alignment mark forming region 11A is about 300 to 500 nm lower than the surface of the semiconductor substrate 1.

Figure 38:
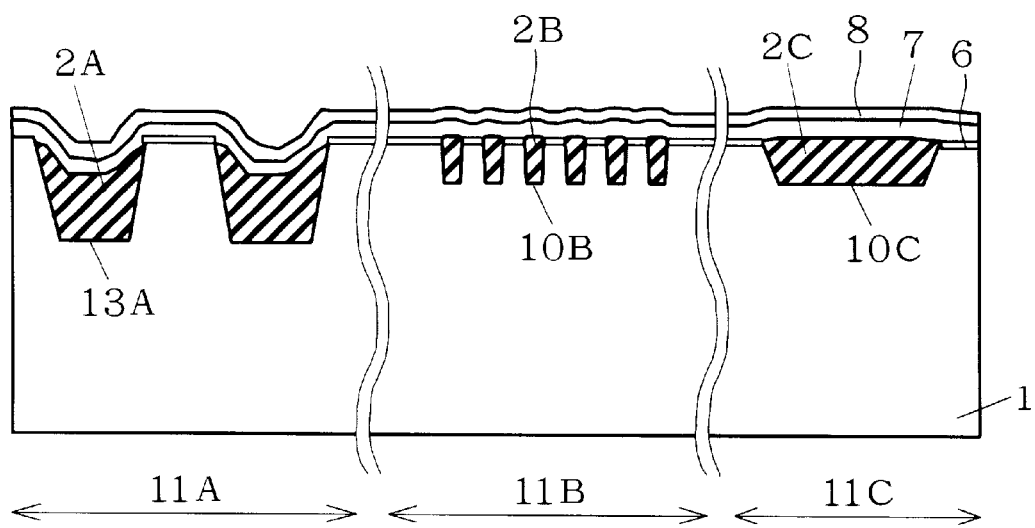

Then, as shown in FIG. 38, the gate oxide film 6 of 4 to 10 nm thick is formed by thermal oxidation, and the polysilicon film 7 of 50 to 150 nm thick doped with phosphorus and the tungsten silicide film 8 of 50 to 150 nm thick are deposited thereon.

Figure 39:
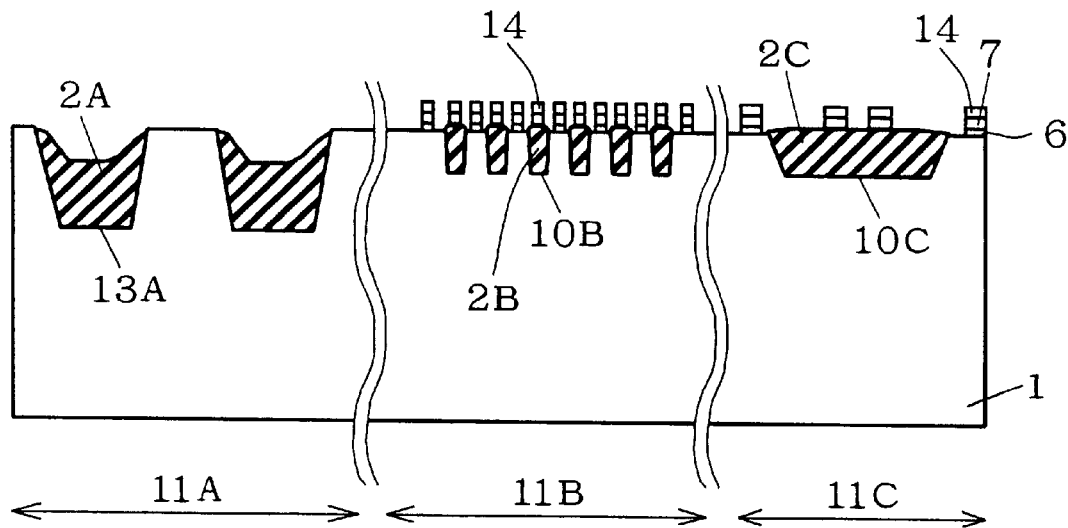
Figure 40:
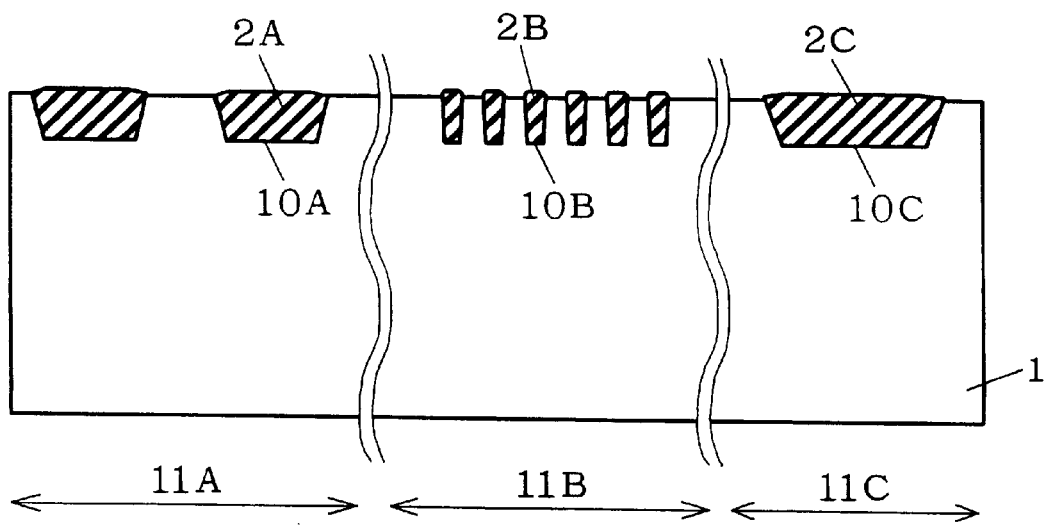
FIG. 40 shows a sectional structure of a conventional semiconductor device (DRAM).
Figure 41:
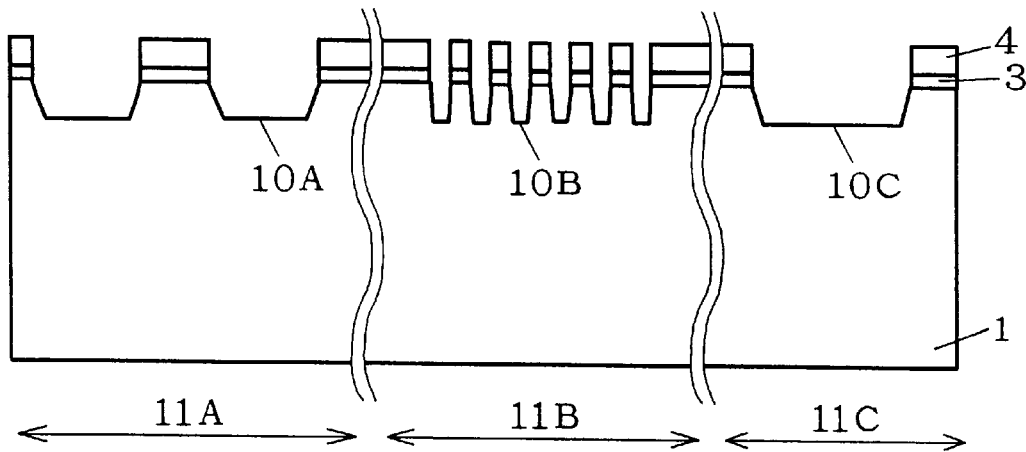
FIGS. 41 through 47 are sectional views illustrating a manufacturing method of the conventional semiconductor device.
Figure 42:
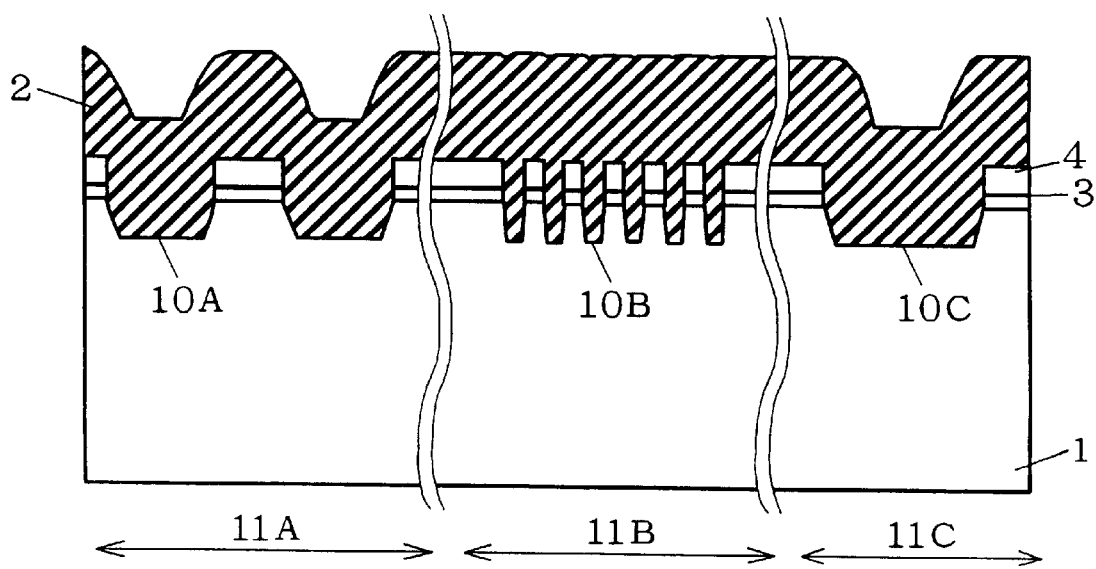
Figure 43:
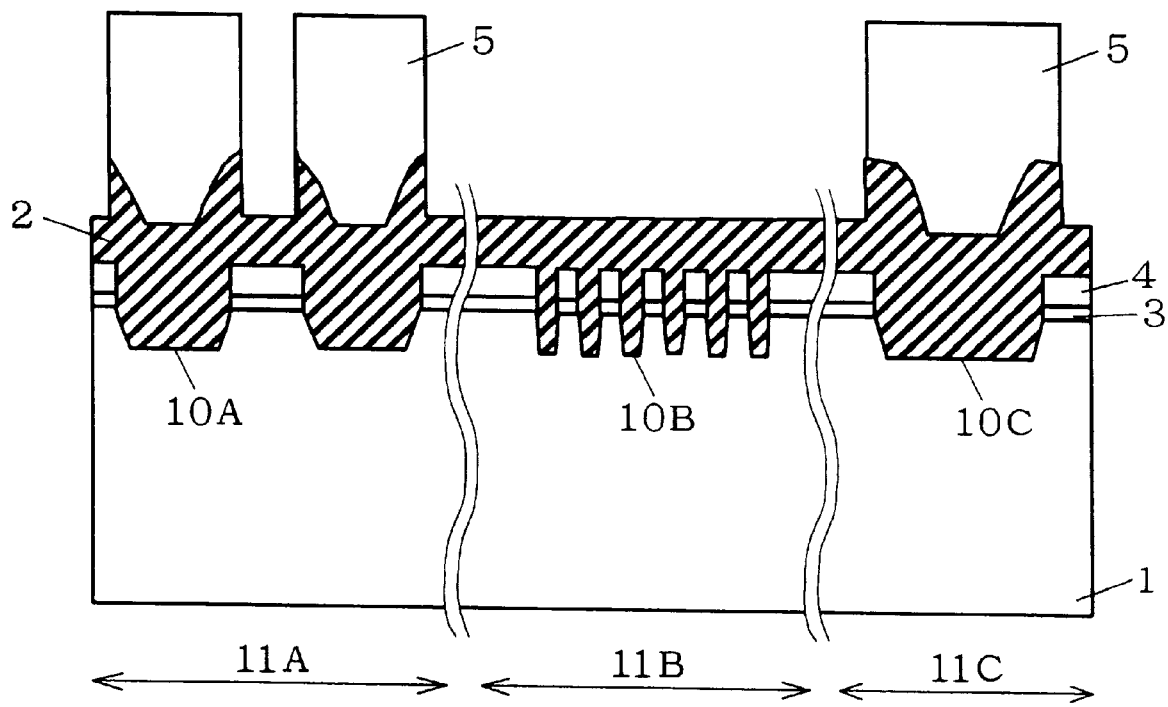
Figure 44:
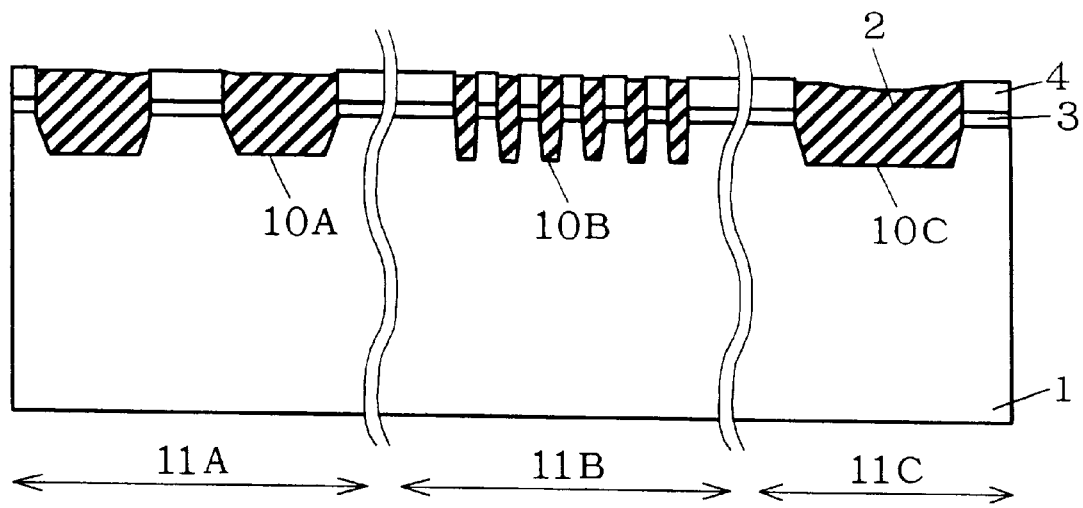
Figure 45:
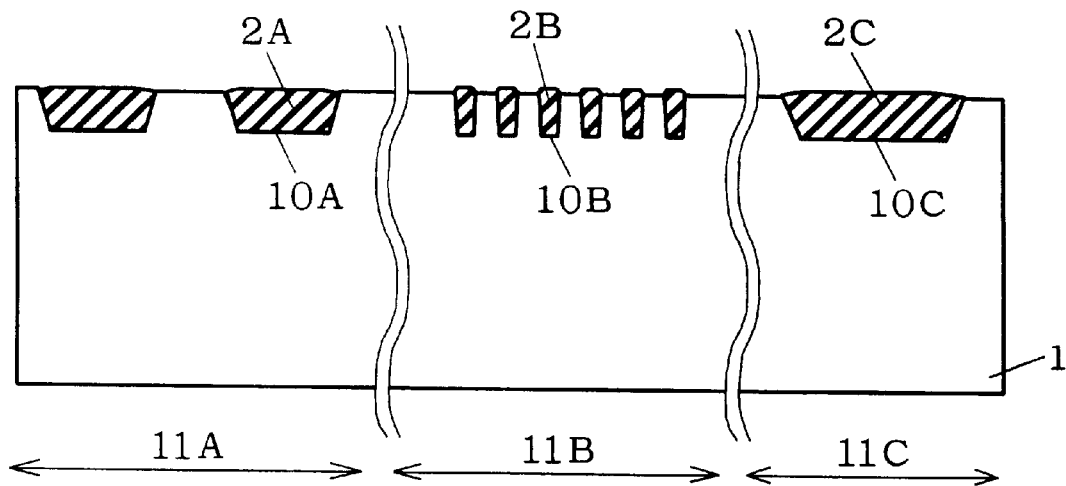
Figure 46:
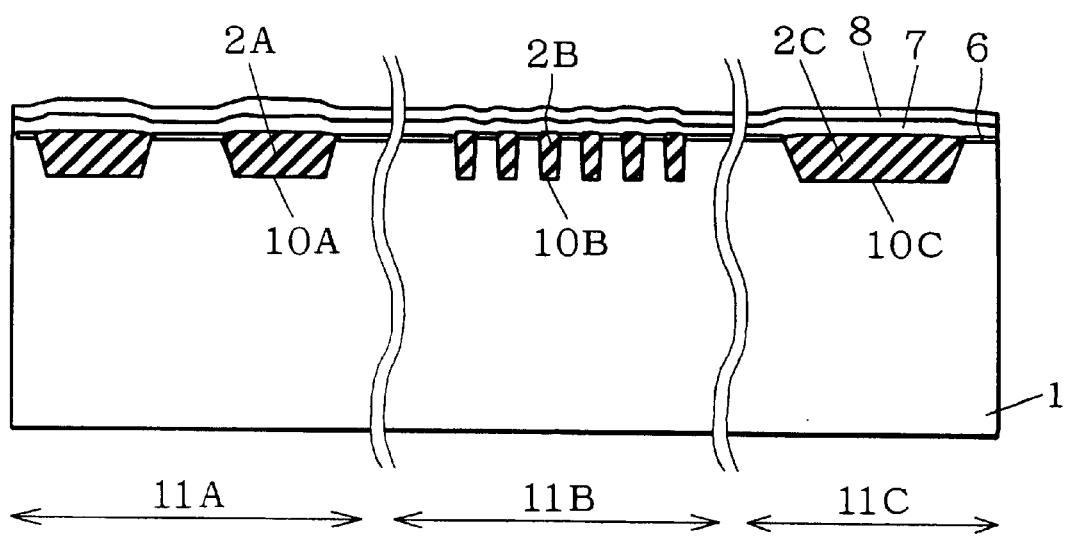
Figure 47:
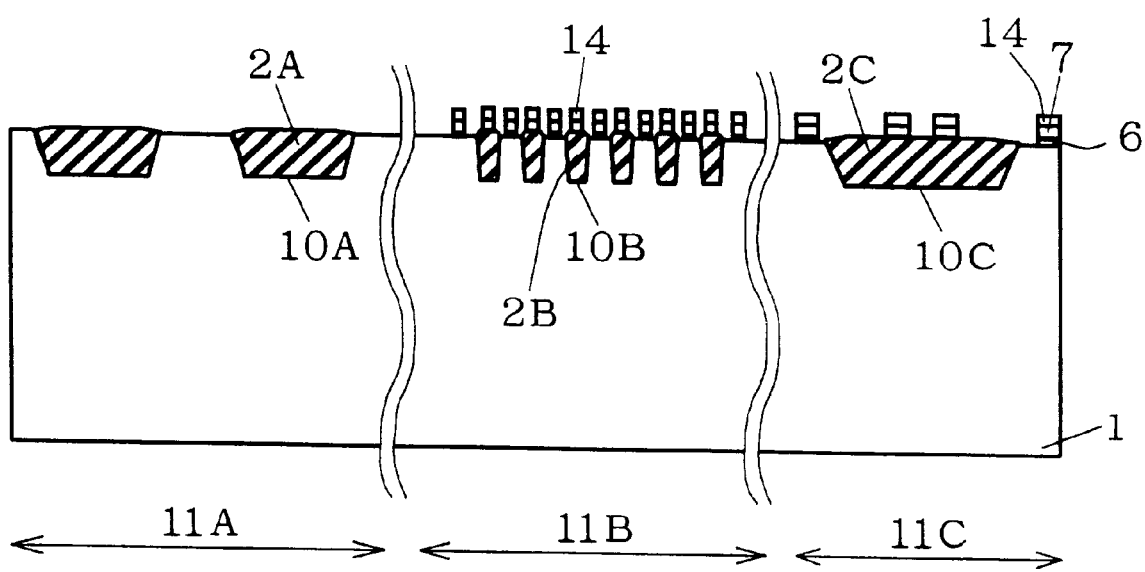

Next, as shown in FIG. 39, an alignment processing is performed to form a pattern for superimposing a gate electrode on the element isolation region by photolithography with the alignment mark (embedded silicon oxide film 2A) formed in the process shown in FIG. 37. In the processing, the tungsten silicide film 8 and the polysilicon film 7 are partially removed by dry etching to form the gate electrode 14.

At this time, the surface of the embedded silicon oxide films 2B and 2C are almost level with the surface of the semiconductor substrate 1. Thus, the electrode material hardly remains in the edges of the trenches 10B and 10C in formation of the gate electrode 14, improving yield of elements.

According to the manufacturing method of the third preferred embodiment, formation of a resist pattern and dry etching both for reducing absolute difference in level are not performed in the trench 13A of the alignment mark region 11A. However, dry etching may be performed in the trench 13A of the alignment mark region 11A, as described in the first manufacturing method of the first preferred embodiment shown in FIG. 4, to lower the surface of the silicon oxide film 2 in the trench 13A. In that case, the difference in level between the embedded silicon oxide film 2A and the semiconductor substrate 1 increases, facilitating detection of an alignment mark.

As there is more silicon oxide film 2 to be removed on the trench 10B than on the trench 10C, the process shown in FIG. 35 is indispensable in order to selectively remove the silicon oxide film 2 on the trench 10B of the memory cell 11B is indispensable.

That is, the difference in level between the embedded oxide film 2A and the semiconductor substrate 1 can be increased without any additional steps by simultaneously removing the silicon oxide film 2 formed on the trenches 10B and 10A and a part of the silicon oxide film 2 filled in the trench 10A.

4. Additional Notes

Though the silicon oxide film 2 is formed by the LPCVD method in the manufacturing methods according to the first through third preferred embodiments, other methods are also applicable to form the silicon oxide film 2. In that case, as film thickness of the silicon oxide film 2 must be determined depending on the width of the trenches, a resist mask forming region should be formed so as to reduce absolute difference in level in accordance with embedded configuration of the silicon oxide film 2.

Further, the gate electrode material is a layered film consisting of the polysilicon film and the tungsten silicide film in the first through third preferred embodiments, the silicide film can be other silicide films such as titanium silicide, or may be substituted by a metal film such as tungsten or a layered film consisting of a metal film and a metal nitrogen film. Of course, the same effect can be obtained in that case. Furthermore, a layered film consisting of the polysilicon film and the tungsten film may be substituted by a metal film.

While the invention has been described in detail, the foregoing description is in all aspects illustrative and not restrictive. It is understood that numerous other modifications and variations can be devised without departing from the scope of the invention.

What is claimed is:

1. A semiconductor device having a trench-type element isolation structure for semiconductor element isolation, comprising:

a semiconductor substrate;

an alignment mark region formed in said semiconductor substrate, having an alignment mark which includes a first trench formed in an upper portion of said semiconductor substrate and an insulating film formed in a lower portion of said first trench in such a manner that a side face of said first trench is completely exposed at least in an upper portion thereof; and an element forming region formed in said semiconductor substrate, having an element isolation insulating film for insulating a plurality of semiconductor elements from each other, said element isolation insulating film being filled in a second trench formed in an upper portion of said semiconductor substrate, said first and second trenches having about the same depth below the surface of said semiconductor substrate, wherein a difference in level is provided between the surface of said insulating film and the surface of said semiconductor substrate by forming said insulating film lower than the surface of said semiconductor substrate so that another difference in level reflecting said difference in level between the surface of said insulating film and the surface of said semiconductor substrate is provided on a surface of an upper formation layer when said upper formation layer is formed on said semiconductor substrate including said insulating film.

2. The semiconductor device of claim 1, wherein the surface of said element isolation insulating film is higher than the surface of said semiconductor substrate, said semiconductor device further comprising:

a control electrode for controlling operation of elements, formed on said element forming region having said element isolation insulating film.

3. The semiconductor device of claim 1, wherein the surface of said insulating film in alignment mark trench is over 30 nm lower than the surface of said semiconductor substrate.

4. The semiconductor device of claim 1, further comprising an electrode layer formed on said element forming region, said electrode layer including one of a metal layer and a metal compound layer.

5. The semiconductor device of claim 1, wherein a plane structure of said first trench of said alignment mark is a rectangle with short sides thereof two or more times longer than a depth of said first trench.

* * * * *